(12) United States Patent
Yu et al.

(10) Patent No.: US 10,544,999 B2
(45) Date of Patent: Jan. 28, 2020

(54) THERMAL EXTRACTION USING RADIATION

(71) Applicant: The Board of Trustees of the Leland Stanford Junior University, Palo Alto, CA (US)

(72) Inventors: Zongfu Yu, Stanford, CA (US); Nicholas Sergeant, Menlo Park, CA (US); Torbjorn Skauli, Oslo (NO); Gang Zhang, Beijing (CN); Hailiang Wang, Stanford, CA (US); Shanhui Fan, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 861 days.

(21) Appl. No.: 13/830,559

(22) Filed: Mar. 14, 2013

(65) Prior Publication Data

US 2014/0102686 A1 Apr. 17, 2014

Related U.S. Application Data

(60) Provisional application No. 61/714,557, filed on Oct. 16, 2012.

(51) Int. Cl.
 *F28F 9/00* (2006.01)
 *F28F 13/00* (2006.01)

(52) U.S. Cl.
 CPC ............... *F28F 9/00* (2013.01); *F28F 13/00* (2013.01); *F28F 2013/005* (2013.01); *H01L 2924/0002* (2013.01)

(58) Field of Classification Search
 CPC ...... F28F 13/18; F28F 2245/06; F24F 5/0089; F25B 23/003; F21V 29/004; G02B 6/4269
 See application file for complete search history.

(56) References Cited

U.S. PATENT DOCUMENTS

| | | | | |
|---|---|---|---|---|
| 3,205,937 A | * | 9/1965 | Shyffer | 165/96 |
| 6,271,461 B1 | * | 8/2001 | Fraas et al. | 136/253 |
| 6,899,170 B2 | * | 5/2005 | Biter et al. | 165/277 |
| 7,078,697 B2 | * | 7/2006 | Barker | B82Y 20/00 |
| | | | | 250/343 |
| 7,308,008 B2 | * | 12/2007 | Freeman et al. | 372/36 |
| 7,588,351 B2 | * | 9/2009 | Meyer | 362/294 |
| 2005/0263269 A1 | * | 12/2005 | Kaneko | H01K 1/08 |
| | | | | 165/146 |

(Continued)

OTHER PUBLICATIONS

The Zero Point Field How Thoughts Become Matter.*

(Continued)

*Primary Examiner* — Nelson J Nieves
(74) *Attorney, Agent, or Firm* — Crawford Maunu PLLC

(57) ABSTRACT

In one embodiment of the present disclosure, a device is disclosed comprising a macroscopic thermal body and an extraction structure that is electromagnetically-coupled to the thermal emitting area of the thermal body. The macroscopic thermal body having a thermal emitting area, and the extraction structure configured and arranged to facilitate emission from, or receipt to the thermal emitting area that exceeds a theoretical, Stefan-Boltzmann, emission limit for a blackbody having the same thermal emitting area as the thermal body.

20 Claims, 13 Drawing Sheets

(56) References Cited

U.S. PATENT DOCUMENTS

| | | | | |
|---|---|---|---|---|
| 2008/0246580 | A1* | 10/2008 | Braun | C25D 1/10 338/20 |
| 2009/0230125 | A1* | 9/2009 | Kono | A47J 27/004 219/680 |
| 2010/0031990 | A1* | 2/2010 | Francoeur | H02S 40/44 136/206 |
| 2010/0040796 | A1* | 2/2010 | Chueh | 165/185 |
| 2010/0045970 | A1* | 2/2010 | Raschke | G01J 3/02 356/51 |
| 2010/0067241 | A1* | 3/2010 | Lapatovich | C09K 11/02 362/361 |
| 2011/0170302 | A1* | 7/2011 | Breidenassel et al. | 362/373 |
| 2011/0198570 | A1* | 8/2011 | Venkatasubramanian | H01L 23/3677 257/30 |
| 2012/0080699 | A1* | 4/2012 | Chowdhury et al. | 165/185 |

OTHER PUBLICATIONS

Incropera Fundamentals Heat Mass Transfer 7th.*
Holman Heat Transfer.*
Xiaoyuan Chen et al. "Breakdown of the Planck blackbody radiation law at nanoscale gaps", 2009.*
Paolo et al., Nanoantennas for visible and infrared radiation, Nov. 29, 2011.*
C. M.Cornelius and J. P. Dowling, "*Modification of Planck blackbody radiation by photonic band-gap structures*," Phys. Rev. A 59, pp. 4736-4746 (1999).
J. B. Pendry, "*Radiative Exchange of Heat Between Nanostructures*," J. Phys.: Condens. Matter. 11, pp. 6621-6633(1999).
S. Maruyama, T. Kashiwa, H. Yugami, and M. Esashi, "*Thermal radiation from two-dimensionally confined modes in microcavities*," App. Phys. Lett. 79, pp. 1393-1395 (2001).
J.-J. Greffet, R. Carminati, K. Joulain, J.-P. Mulet S. Mainguy and Y. Chen, "*Coherent emission of light by thermal sources*," Nature 416, pp. 61-64 (2002).
M. U. Pralle, N. Moelders, M. P. McNeal, I. Puscasu, A. C. Greenwald, J. T. Daly, E.A. Johnson, T. George, D.S. Choi, I. El-Kady and R. Biswas, "*Photonic crystal enhanced narrow-band infrared emitters*," App. Phys. Lett. 81, pp. 4685-4687 (2002).
J. G. Fleming, S. Y. Lin, I. El-Kady, R. Biswas and K. M. Ho, "All-metallic three-dimensional photonic crystals with a large infrared bandgap," Nature 417, pp. 52-55 (2002).
I. Celanovic, D. Perreault, and J. Kassakian, "*Resonant-cavity enhanced thermal emission*," Phys. Rev. B 72, p. 075127 (2005).
M. Laroche, C. Arnold, F. Marquier, R. Carminati, J.-J. Greffet, S. Collin, N. Bardou and J.-L. Pelouard, "*Highly directional radiation generated by a tungsten thermal source*," Opt. Lett. 30, pp. 2623-2625 (2005).
A.I. Volokitin and B. N. J. Persson, "*Near-field radiative heat transfer and noncontact friction*," Rev. Mod. Phys. 79, pp. 1291-1329 (2007).
N. Dahan, A. Niv, G. Biener, Y. Gorodetski, V. Kleiner, and E. Hasman. "*Enhanced coherency of thermal emission: Beyond the limitation imposed by delocalized surface waves*," Phys. Rev. B 76, p. 045427 (2007).
C.-M. Wang, Y.-C. Chang, M-W. Tsai, Y.-H. Ye, C.-Y. Jiang, Y.-T. Change and S.-C. Lee, "*Reflection and emission properties of an infrared emitter*," Opt. Express 15, pp. 14673-14678 (2007).
S. ingvarsson, L. Klein, Y.-Y. Au, J. Lacey, and H. Hamann, "*Enhanced thermal emission from individual antenna-like nanoheaters*," Opt. Express 15, pp. 11249-11254 (2007).
E. Rephaeli and S. Fan, "*Absorber and emitter for solar thermophotovoltaic systems to achieve efficiency exceeding the Shockley-Queisser limit*," Opt. Express 17, pp. 15145-15159 (2009).
J. A. Schuller, T. Taubner and M. L. Brongersma, "*Optical antenna thermal emitters*," Nat Photon 3, pp. 658-661, (2009).
Z. Yu, A. Raman and S. Fan, "*Fundamental limit of nanophotonic light trapping for solar cells*," Proc. Nat. Acad. Sci. USA 107, pp. 17491-17496 (2010).
J.-J. Greffet, "Applied physics: Controlled incandescence," Nature 478, pp. 191-192 (2011).
X. Liu, T. Tyler, T. Starr, A Starr, N. Jokerst, and W. Padilla, "Taming the Blackbody with Infrared Metamaterials as Selective Thermal Emitters," Phys. Rev. Lett. 107, p. 045901 (2011).
Y.-X. Yeng, M. Ghebrebrhan, P. Bermel, W. Chan, J. Joannopoloulos, M. Solijacic and I. Celanovic, "*Enabling high-temperature nanophotonics for energy applications*," Proc. Natl. Acad. Sci. vol. 109, No. 7, pp. 2280-2285 (2012).

* cited by examiner

THERMAL EXTRACTION USING RADIATION

RELATED DOCUMENTS

This patent document claims benefit under 35 U.S.C. § 119 to U.S. Provisional Patent Application Ser. No. 61/714,557, entitled "Thermal Extraction Using Radiation" and filed on Oct. 16, 2012, which is fully incorporated herein by reference; this patent document and the Appendices A-B filed in the underlying provisional application, including the references cited therein and the appended figures, are fully incorporated herein by reference.

FIELD

Aspects of the present disclosure are directed toward facilitation of far-field thermal emissions, as well as methods and devices in, and stemming from, the same.

OVERVIEW

The understanding of far-field thermal radiation had directly led to the discovery of quantum mechanics a century ago, and is of practical importance for applications in energy conversions, radiative cooling, and thermal control.

Consistent with the Stefan-Boltzmann law, it has previously been assumed that for any macroscopic thermal emitter, the coupled (emitted to received) power within any given frequency range cannot exceed that of a blackbody with the same surface area. For any macroscopic thermal body, the upper limit how much power can be dissipated is therefore commonly considered as a universal property that is independent of its internal characteristics.

While experiments have demonstrated that two thermal bodies in close proximity to each other can have thermal conductance exceeding the prediction from the Stefan-Boltzmann law. Such an enhancement, however, is believed to be a purely near-field effect. Additionally, the absorption cross-section of a single optical antenna can exceed its geometric cross-section. Within a narrow frequency range, the power spectral density of such an emitter can significantly exceed that of a blackbody, if the emitter is compared to a blackbody with the same geometric cross-section. In this situation, the size of the object is typically comparable to or smaller than the wavelengths of the thermal radiation.

SUMMARY

In one embodiment of the present disclosure, a device is disclosed comprising a macroscopic thermal body and an extraction structure that is electromagnetically-coupled to the thermal emitting area of the thermal body. The macroscopic thermal body having a thermal emitting area, and the extraction structure configured and arranged to facilitate emission from, or receipt to the thermal emitting area that exceeds a theoretical, Stefan-Boltzmann, emission limit for a blackbody having the same thermal emitting area as the thermal body.

Aspects of the present disclosure are also directed toward thermal coupling between a macroscopic (a scale larger than the thermal radiation wavelength) thermal body and far-field medium (such as a vacuum) that significantly exceeds the corresponding blackbody of the same area, within the constraint of the second law of thermodynamics. To achieve such an enhancement, in certain embodiments, the thermal body can be configured with an internal electromagnetic density of states (DOS) greater than that of the medium, and a thermal extraction mechanism is provided to increase the contributions of internal modes to far-field radiation.

BRIEF DESCRIPTION OF THE FIGURES

Various example embodiments may be more completely understood in consideration of the following detailed description in connection with the accompanying drawings.

Figure 1:
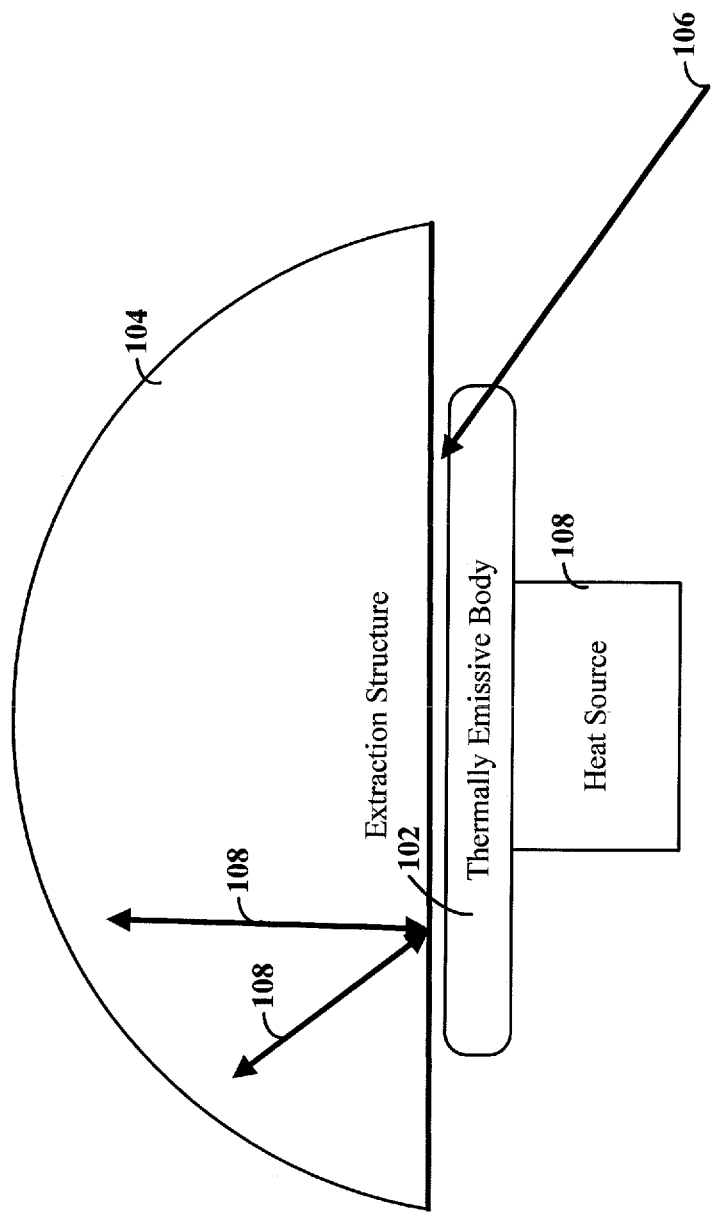
FIG. 1 depicts a system for facilitating thermal radiation from a macroscopic thermal body, consistent with embodiments of the present disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

DESCRIPTION OF EXAMPLE EMBODIMENTS

The present disclosure is related to methods and apparatuses directed to utilization of a macroscopic thermal body having a thermal emitting area, such as the facilitation of far-field thermal emissions, as well as methods and devices related to the same.

Various aspects of the present disclosure are directed towards devices and methods that include the utilization of a macroscopic thermal body having a thermal emitting area. These devices and methods can include use of an extraction structure that is electromagnetically-coupled to the thermal emitting area of the thermal body. The extraction structure facilitates emission from the thermal emitting area. In certain instances, this facilitation of electromagnetic radiation (far-field emission where the geometric features or distances are equal or larger than the characteristic wavelength) can allow macroscopic thermal body to exceed a theoretical, Stefan-Boltzmann emission limit for a blackbody having the same thermal emitting area as the thermal body. In certain more specific embodiments, the macroscopic thermal body has internal electromagnetic density of states that is greater than the internal electromagnetic density of states of a vacuum.

The theoretical, Stefan-Boltzmann emission limit for a blackbody can be adjusted to account for different surrounding mediums (e.g., a vacuum or the atmosphere). For instance, while the theoretical limit of an object having a certain area can be different depending upon the surrounding mediums, the limit can still be determined. As used herein, comparisons of the thermal emissivity of an object and the theoretical limit can be made irrespective of any particular surrounding medium. Moreover, the far-field thermal emission for a less than perfect emissive body (non-blackbody) can be improved using aspects of the present disclosure. This improvement may not exceed the Stefan-Boltzmann emission limit for a blackbody, but would exceed the Stefan-Boltzmann emission limit when adjusted to account for the less than perfect emissive body.

For various embodiments of the devices and methods of the present disclosure, the extraction structure has an index of refraction that is greater than air. Additionally, the extraction structure, consistent with various aspects of the present disclosure, can provide enough radiation channels over the thermal emitting area to ensure that additional (or all) internal modes of the emitter can out-couple.

In certain embodiments, the extraction structure has a density of states that is larger than that of the thermal emitting area. Moreover, in certain embodiments, the extraction structure can provide accessibility to a far-field vacuum, or another far-field medium, for optical modes that receive radiation from the thermal emitting area. In these embodiments, the extraction structure provides the accessibility by way of constraints on the geometry of the extraction medium.

Turning now to the figures, FIG. 1 depicts a system for facilitating thermal radiation from a macroscopic thermal body, consistent with embodiments of the present disclosure. Macroscopic thermal body 102 is a thermally (electromagnetically) emissive body. In certain embodiments, a heat source 108 can be thermally coupled to the thermally emissive body. Heat is allowed to radiate from the thermal body 102. The amount of heat that can radiate from the thermal body 102 is limited by a number of factors; however, it was generally believed to be bound by an upper limit. This upper limit is based upon the rate of radiant heat energy emitted by a blackbody having the same area, and is sometimes referred to as the Stefan-Boltzmann law. Consistent with certain embodiments, the macroscopic thermal body 102 is configured and arranged with an internal density of states that is higher than that of the surrounding medium.

Extraction structure 104 is configured and arranged as interface between thermal body 102 and emitted thermal radiation into vacuum, air or another far-field medium. In particular embodiments, extraction structure 104 can facilitate emission from the thermal emitting area by increasing the number of internal modes that can out-couple. The extraction structure 104 can also be configured to limit the amount of radiation that it emits intrinsically (e.g., by being substantially transparent to the relevant electromagnetic radiation frequencies). Certain embodiments recognize that the extraction structure 104 can be configured and arranged with some degree of absorption (e.g., not fully transparent). Thus, even if a fraction of the radiation is absorbed on its way through the extraction structure 104 the overall emission can still be enhanced. Moreover, certain embodiments are directed toward an extraction structure 104 that is configured an arranged to absorb a significant amount of radiation and thereby functions as a heat sink (using the heat capacity of the extraction structure). This can be particularly useful for cooling (e.g., relative to the use of conductive cooling of the source). For example, certain embodiments can be configured for removal of a pulse of heat. Using a moderately absorbing extraction medium, the heat pulse can be deposited in a large volume and hence potentially with a large thermal capacity (e.g., relative to a conductive medium). Accordingly, a device can be configured to cool a heat source by absorption of the radiation in the extraction structure, combined with conduction of heat away from the surface of the extraction structure.

Aspects of the present disclosure recognize that total internal reflection of electromagnetic radiation 108 (e.g., light) can occur at the interface between the medium inside the cavity and vacuum outside. This can prevent a significant portion of the internal electromagnetic modes from coupling to vacuum. Accordingly, the extraction structure 104 can be configured and arranged to eliminate or reduce such total internal reflection. This can include controlling the curvature of the extraction structure 104 and/or the refractive index. As a non-limiting, simplistic example, the extraction structure 104 could be a hemisphere with a radius (R) and an index of refraction ($n_e$). The thermal body 102 could be a circular disk with a radius (r) centered on the flat part of the hemisphere. As such, the elements could be arranged such that $R \geq n_e r$, and thereby be sufficient to ensure that any radiation 108 originated from the open area S, when it reaches the top surface of the dome, has an incident angle less than the total internal reflection angle.

Aspects of the present disclosure recognize that each of the extraction structure 104 and the thermal body 102 can have various different shapes and configurations. While the certain shapes (e.g., spherical and/or circular objects) may lend themselves to simpler calculations, the principles disclosed herein can be applied to other shapes and configurations.

Certain embodiments of the present disclosure recognize that the physical distance 106 between extraction structure 104 and the thermal body 102 can have a significant effect on the ability to out couple modes from the thermal body 102. For instance a distance of 30 µm, can inhibit photon tunneling (but yet small enough to preserve geometrical optical lens effects) for thermal radiation with a vacuum wavelength shorter than about 30 µm. It has been discovered that effective coupling can be accomplished by keeping the distance between the thermal body 102 and the extraction structure 104 close enough to allow photon tunneling between the thermal body 102 and the extraction structure 104. Such photon tunneling can be allowed when the distance is kept significantly less than the thermal wavelength of emitted energy. Since the surrounding thermal extraction medium does not need to be maintained in physical contact with the thermal body 102, the temperature of the extraction medium can be maintained substantially independently, for example, at room temperature.

The structure of FIG. 1 can be particularly useful for cooling of various heat sources 108. The amount of heat that can be dissipated by far-field thermal radiation is limited by the effective area of the thermal body. In many environments, the size of the thermal emitter can be limited by outside factors, such as thermal emissions in a device that is subject to size constraints. Moreover, the cost of providing a larger thermal emitter area can place further constraints on the size of the thermal emitter. Accordingly, the use of the extraction structure 104 to increase the effective thermal emission capabilities can facilitate the use of smaller, more efficient and/or cheaper thermal bodies 102.

Various embodiments are directed toward a thermal light source for thermal photovoltaic devices. In such cases, the size of thermal body 102 can be kept relatively small while maintaining high emission power through the use of the extraction structure 104.

Certain embodiments can be used for cooling electronics. Designers of electronic devices often incur significant cost (including cost of design and cost of components) in cooling of electronic circuits. For instance, as processing circuits become more powerful and smaller, the ability to cool the electronics becomes more critical and difficult at the same time. Moreover, many cooling mechanisms rely primary upon cooling through convection and/or conduction. For instance, a heat sink can use conduction to remove heat from a circuit and convection to transfer the heat to the surrounding environment/air. Such cooling mechanisms can be hampered by a lack of air flow. Accordingly, cooling provided through far-field thermal emissions can be particularly useful, either alone or in combination with other cooling mechanisms.

For instance, an air-cooled heat sink that is designed to sink heat away from electronics can be modified to include a thermal body 102 and an extraction structure 104 that further facilitates radiation-based cooling. This can be particularly useful when there is limited amount of air flow to the heat sink.

The size and scale of the thermal body 102 and the extraction structure 104 can be adjusted depending upon the particular application and use. For instance, large scale cooling can be carried out using relatively large sizes for thermal body 102 and the extraction structure 104. This can be useful for any number of different environments. For instance, cooling of buildings could be facilitated using a large thermal body 102 and extraction structure 104 that is thermally coupled to the building (acting as a heat source 108). In another instance, cooling of components of building heating/cooling systems can be facilitated (e.g., whether the system is a separate air conditioning unit or a heat pump). In still other embodiments, temperature control can be provided for spacecraft, which lacks of heat transfer medium due to being located in a vacuum.

Particular embodiments are directed toward adjusting the cooling efficiency by modifying the distance between the thermal body 102 and the extraction structure 104. When additional heat dissipation is desired, the distance can be reduced so as to allow structure 104 to be close enough to allow photon tunneling. When less heat dissipation is desired, the distance can be increased so as to prevent photon tunneling. For instance, cooling of a building can be desirable in the summer months, but not in the winter months.

Aspects of the present disclosure are directed toward manufacturing a device having radiation properties that facilitate far-field thermal emissions (e.g., by exceeding the Stefan-Boltzmann law). For instance, manufacturing of the device can include a process in which the device is tested relative to the Stefan-Boltzmann law so as to confirm the effectiveness of the thermal emissions. This testing can be particularly useful for insuring that the extraction structure 104 close enough to allow photon tunneling between the thermal body 102 and/or that the macroscopic thermal body has internal electromagnetic density of states that is greater than internal electromagnetic density of states of the surrounding medium (e.g., vacuum).

Figure 2:
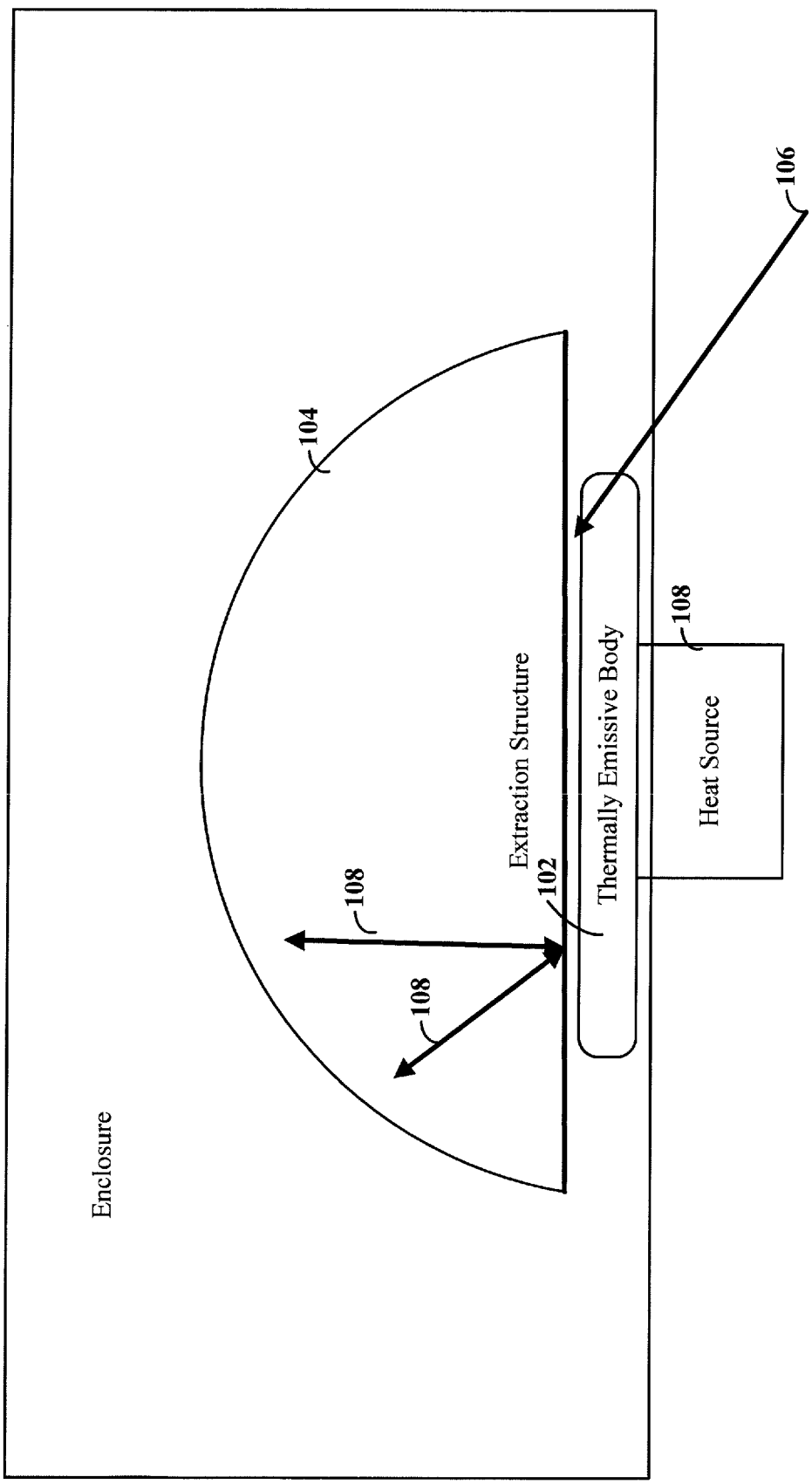
FIG. 2 depicts a system for facilitating the transfer of thermal radiation from a macroscopic thermal body to an external object or area, consistent with embodiments of the present disclosure.

FIG. 2 depicts a system for facilitating the transfer of thermal radiation from a macroscopic thermal body to an external object or area, consistent with embodiments of the present disclosure. Thermal transfer structure 202 is configured and arranged to facilitate far-field thermal radiation and thereby transfer heat from heat source 204 to external locations/objects. Enclosure/transferee body 206 can be configured and arranged to receive and absorb thermal radiation from thermal transfer structure 202. This can be useful for a variety of applications.

For instance, the use of far-field radiation allows for heat transfer without direct connection between the source of heat and the recipient of the heat. Accordingly, heat can be transferred between two objects without using (or in addition to) conduction/convection, including heat transfer in vacuum conditions, such as may be useful for satellites or other spacecraft.

Figure 3:
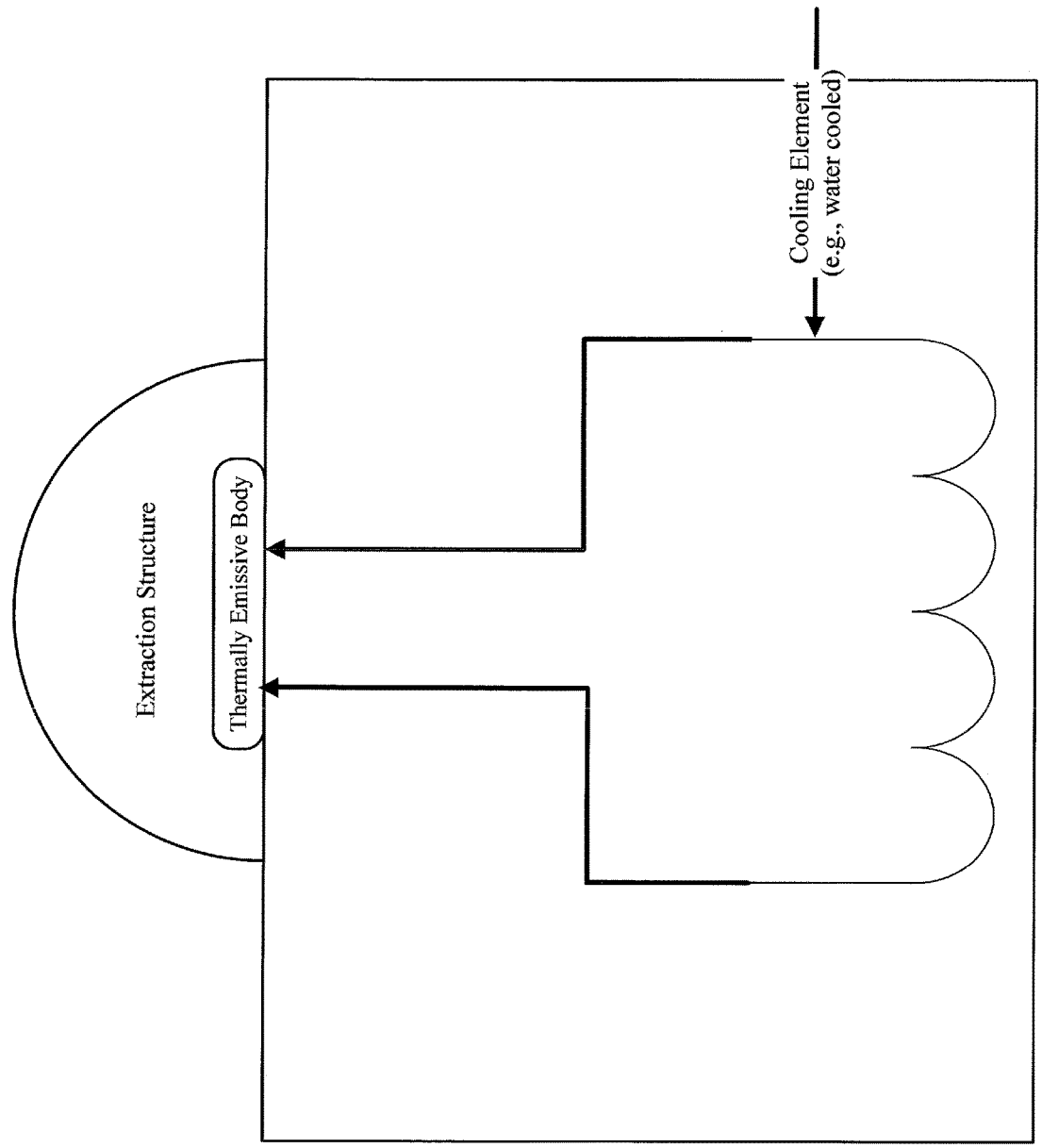
FIG. 3 depicts a system for facilitating the removal of heat from a heat source using one or more additional heat transfer techniques, consistent with embodiments of the present disclosure.

FIG. 3 depicts a system for facilitating the removal of heat from a heat source using one or more additional heat transfer techniques, consistent with embodiments of the present disclosure. Thermal transfer structure 302 is configured and arranged to facilitate far-field thermal radiation and thereby transfer heat from heat source 304 to allow for cooling thereof. As a non-limiting example, heat source 304 can include a cooling element that can use one or more of conduction or convection to transfer heat to macroscopic thermal body 306. Heat can then be dissipated from macroscopic thermal body 306 using an extraction structure.

Consistent with certain embodiments of the present disclosure, additional (optional) cooling of thermal body 306 can be employed. For instance, heat can be extracted from thermal body 306 into the ambient air using convection and/or using forced air. This can be further facilitated by providing an air flow path along vertically exposed portions of thermal body 306. An exposed area at the top of thermal body 306 can also be used to provide removal of heat using far-field thermal emissions.

The various embodiments discussed herein are not intended to be limiting. Rather, a number of different modifications, variations and combinations of different heating and cooling mechanisms can be used. The following discussion of experimental embodiments provides further support for such modifications, variations and combinations and is also not intended to be limiting.

Various aspects of the present disclosure are directed towards tailoring of far-field thermal emission. For macroscopic emitters that have at least one of the dimensions exceeding several wavelengths, both the spatial directivity and the spectrum of far-field thermal emission can be modified with structures such as photonic crystals, cavity arrays, and metamaterials. These structures, however, can emit more thermal radiation power than a blackbody with the same area. A blackbody, by definition, has a total thermal emission power $P=\sigma T^4 S$ to far-field vacuum, where S is the area of the blackbody, a result that is commonly referred to as the Stefan-Boltzmann law. Thus, it was believed that a macroscopic body cannot have its thermal emission power exceed that given by the Stefan-Boltzmann law.

Various aspects of the present disclosure are premised upon the surprising realization that a macroscopic thermal body can emit more thermal radiation to far-field vacuum, as compared to a blackbody of the same area, i.e., a macroscopic thermal body exceeding the blackbody limit. In certain embodiments, this is accomplished using a macroscopic thermal body with an internal density of states that is higher than that of the surrounding medium (e.g., vacuum) and by providing a thermal extraction medium that facilitates the out-coupling of these internal states. Assuming that the thermal extraction medium is transparent, it will not by itself emit radiation.

Aspects of the present disclosure concern broad-band enhancement for macroscopic finite bodies over the entire thermal wavelength range.

Figure 4:
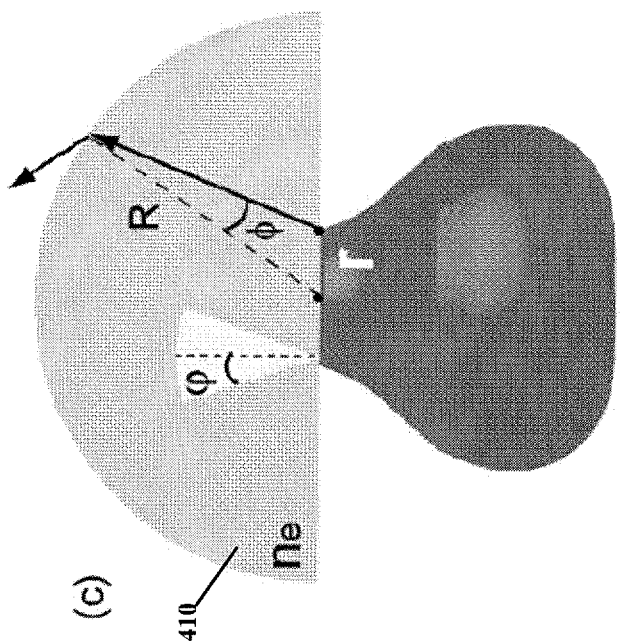
FIG. 4 shows an example emitter formed by an open area of an absorptive cavity and an emission cone of the thermal radiation inside the dome, consistent with various aspects of the present disclosure.
Figure 4:
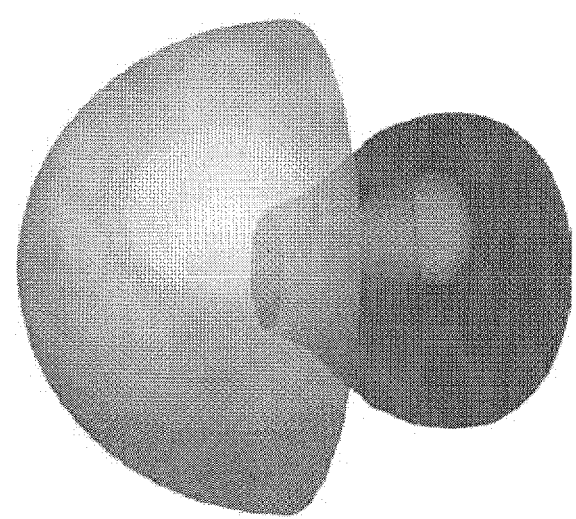
Figure 4:
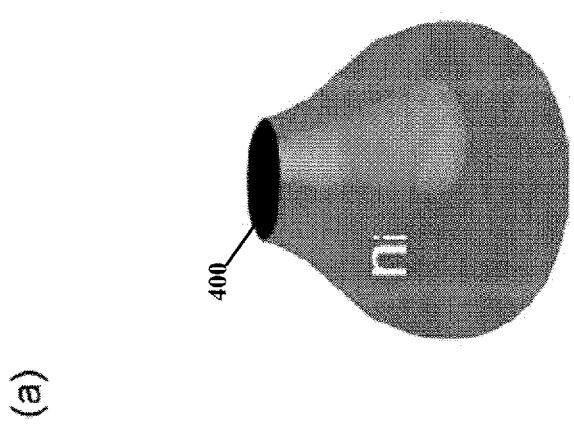

In certain experimental embodiments, a thermal emitter is provided, which consists of a small opening on a cavity (as shown in FIG. 4A). FIG. 4A shows an example emitter formed by an open area 400 of an absorptive cavity. The cavity can be filled with transparent dielectric of refractive index $n_i$. The cavity has vacuum immediately outside. The opening has an area S, and the inner sidewall of the cavity is made of diffusive reflector that also absorbs light. The opening area is completely dark with emissivity of unity: any light entering through the open area bounces many times and eventually gets absorbed by the sidewall. The cavity is maintained at temperature T.

It is further assumed that the cavity is filled with transparent dielectric medium that has a refractive index $n_i$. A cavity with $n_i=1$ is referred to below as an "empty cavity," and a cavity with $n_i>1$ is referred to as a "filled cavity." In such experimental embodiments, perfect anti-reflection is assumed at all interfaces. Independent of the value of refractive index $n_i$, the cavity can have the same external thermal emission characteristics with the same total emitted power $\sigma T^4 S$ to far-field vacuum. Inside the cavity, the internal thermal radiation energy is dependent on the electromagnetic density of states, which scales as $n_i^3$. However, when $n_i>1$, total internal reflection, occurring at the interface between the medium inside the cavity and vacuum outside, prevents a significant portion of the internal electromagnetic modes from coupling to vacuum. The resulting thermal emission to the far-field thus has the same profile independent of internal radiation density.

The structure in FIG. 4A can also be analyzed using a thermal equilibrium argument. In thermal equilibrium, detailed balance dictates the equivalence of absorption and emission. Since the structure exhibits unity emissivity, all the incoming radiation from vacuum outside the cavity is fully absorbed. At temperature T, the incoming radiation power from vacuum is $\sigma T^4 S$. Thus the emission is independent of its internal modal structure.

Various aspects of the present disclosure, utilizing the emitter shown in FIG. 4A, place a semi-spherical dome with refractive index $n_e$ covering the entrance of the cavity, as shown in FIG. 4B. FIG. 4B shows thermal extraction using a semi-spherical dome placed at the opening of the cavity. The dome is transparent and does not emit or absorb any thermal radiations, and has a refractive index $n_e$. This can enhance thermal emission. The dome is in close contact with the open area of the cavity, and in certain embodiments, the dome plays the role of a thermal extraction device that enables all modes inside the cavity to escape into vacuum. The dome itself is assumed to be transparent, so that it does not emit or absorb any thermal radiation.

To calculate the thermal emission from the geometry shown in FIG. 4B, a ray tracing procedure is followed. For simplicity, it is assumed that the opening of the cavity has a circular shape of radius r and the dome has a radius R. Additionally, it is assumed that $R \geq n_e r$, which is sufficient to ensure that any light ray originated from the open area S, when it reaches the top surface of the dome, has an incident angle less than the total internal reflection angle $\phi \geq \sin^{-1}(1/n_e)$ (FIG. 4C, solid arrows), and therefore can escape to far-field vacuum (consistent with various experimentation/example embodiments herein). FIG. 4C depicts cross sections showing emission cone 410 of the thermal radiation inside the dome. Again, perfect anti-reflection at the dome surface is assumed.

The emission from the cavity forms a light cone in the dome. Half apex angle of the light cone is given by:

$$\varphi = \begin{cases} \sin^{-1}(n_i/n_e) & \text{if } n_i \leq n_e \\ \pi/2 & \text{if } n_i > n_e \end{cases} \quad \text{Eq. (1)}$$

To obtain the total emission power, thermal radiation is integrated within the light cone, $$P = \begin{cases} n_e^2 \sigma T^4 \pi r^2 & (n_e < n_i) \\ n_e^2 \sigma T^4 \pi r^2 \dfrac{\int_0^{\varphi_2} \sin(\theta)\cos(\theta)\,d\theta}{\int_0^{\pi/2} \sin(\theta)\cos(\theta)\,d\theta} = n_i^2 \sigma T^4 \pi r^2 & (n_e \geq n_i) \end{cases} \quad \text{Eq. (2)}$$

Since all light in the dome can escape without total internal reflection, Eq. (2) is the total thermal radiation to far-field vacuum.

Figure 5:
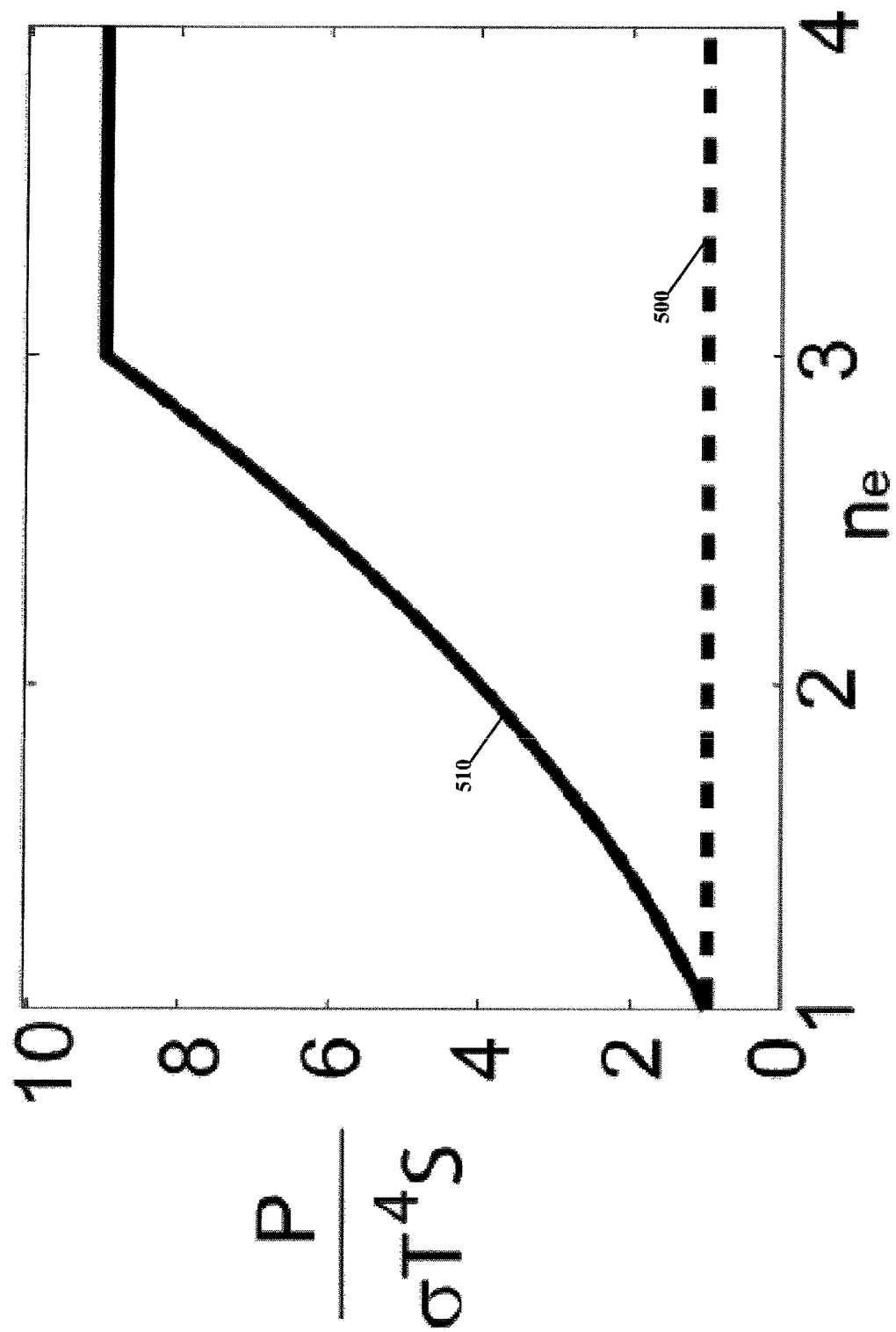
FIG. 5 shows an example total thermal radiation power to far-field vacuum for the structure shown in FIG. 4B, and consistent with various aspects of the present disclosure.

FIG. 5 shows the thermal radiation power P as a function of the refractive index of the dome $n_e$. More specifically, FIG. 5 shows the total thermal radiation power to far-field vacuum for the structure depicted in FIG. 4B, as a function of the refractive index of the dome $n_e$. The solid line in FIG. 5 shows the filled cavity with $n_i=3$, and the dashed line shows an empty cavity with $n_i=1$. The total radiation power from an empty cavity 500 does not change as a function of $n_e$, while the power from the filled cavity 510 increases as $n_e$ increases until $n_e=n_i$. With the assistance of the thermal extraction, the filled cavity can emit up to $n_i^2 S \sigma T^4$ to far-field vacuum, $n_i^2$ times of the emission of a blackbody of the same area S.

Figure 6:
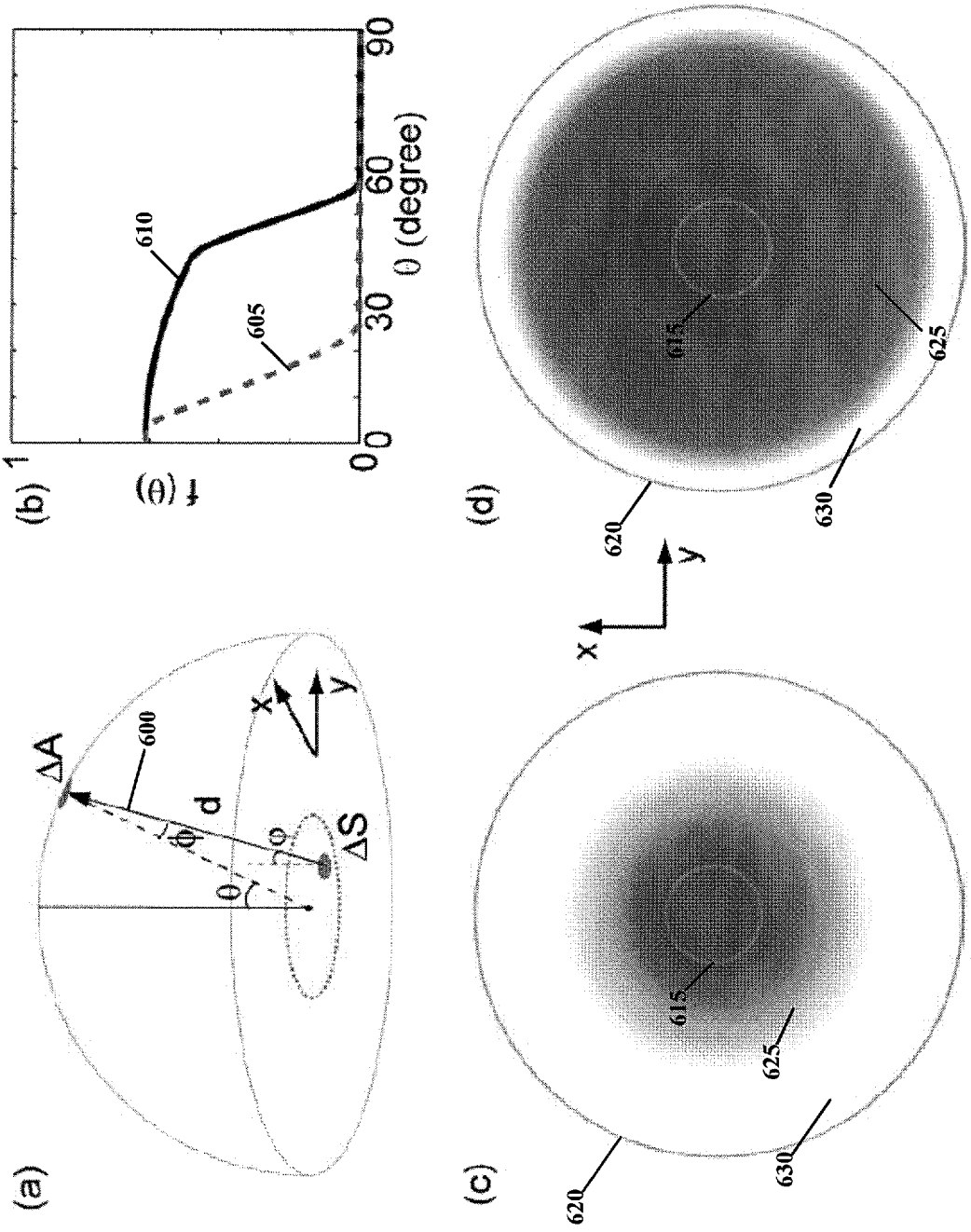
FIG. 6 shows an example distribution of thermal radiation on the surface of the dome for the structure shown in FIG. 4B, and consistent with various aspects of the present disclosure.

FIG. 6 shows a distribution of thermal radiation on the surface of the dome for the structure shown in FIG. 4B. FIG. 6A shows a schematic of the calculation. The solid arrow 600 indicates radiation that is emitted from a small area ΔS on the cavity opening and is received by a small area ΔA on the surface of the dome. FIG. 6B shows a distribution of the radiation power on the surface of the dome as a function of the polar angle θ. The dashed 605 and solid lines 610 are for the cases with empty and filled cavities respectively. FIGS. 6C and 6D show the distribution of the radiation power, plotted on the hemisphere of the dome, for the case of empty (c) and filled (d) cavity. The first circle 615 indicates the emitter area, i.e. the opening area of the cavity. The second circle 620 is the boundary of the dome. Darker region 625 indicates higher emission and the white region 630 has zero emission.

The distribution of thermal radiation on the surface of the dome can be calculated with a schematic shown in FIG. 6A. For a small area ΔA on the surface of the dome, the thermal radiation power it receives from the cavity is $$v_{\Delta A} = \Delta A \sigma T^4 \iint_{\varphi < \varphi_1 \text{ and } x^2 + y^2 \leq r^2} \cos(\varphi)\cos(\phi) n_e^2 \frac{dx\, dy}{\pi d^2} \quad \text{Eq. (3)}$$

The definitions of the geometric parameters in Eq. (3) are provided in FIG. 6A. All radiation that the area ΔA receives can escape the dome. As a dimensionless quantity, a normalized power distribution is defined $$f(\theta) \equiv \frac{v_{\Delta A}}{\Delta A \sigma T^4}, \quad \text{Eq. (4)}$$

to describe the power distribution on the surface of the dome. Due to rotational symmetry, f depends only on the polar angle θ.

As one specific numerical example, a case is calculated where $n_e=4$. A dome radius of R>5r is chosen to satisfy the condition $R \geq n_e r$. $f(\theta)$ is numerically evaluated using Eq. (3) and is shown in FIG. 6B for both empty cavity ($n_f=1$), and filled cavity ($n_f=3$). For both cases, $f(\theta)$ maximizes at normal direction θ=0, since this area is directly above the opening the cavity. $f(\theta)$ decreases as θ increases and eventually vanishes for large θ, since at large θ the corresponding area lies outside the emission cone of cavity. However, the emission profile of the filled cavity expands to a much wider angular range than that of the empty cavity (as shown in FIGS. 7C and 7D). Therefore, when thermal extraction occurs, for example the case here of the filled cavity, the entire dome appears bright.

Based on the theoretical analysis above, the use of thermal extraction is demonstrated to enhance thermal emission beyond the blackbody limit. In certain experimental embodiments, carbon black paint is used as the thermal emission source. In more specific embodiments, the carbon black paint has a refractive index around 2.3 and an emissivity around 0.85 in the near to mid infrared regime. A circular carbon dot is coated on a polished Al sample holder, which provides a low emission background. The dot has a radius r=1.025 mm with an area of 3.3 mm² For a thermal extraction device, in certain embodiments, a semi-spherical dome made from ZnSe, a transparent material with negligible thermal emission in the near to mid IR region. In various experimental embodiments, the hemisphere has a diameter of 6 mm and refractive index 2.4. It satisfies the condition $R \geq n_e r$, which ensures that light entering into the hemisphere from the thermal emitter is not trapped by the total internal reflection at the dome interface.

An aluminum sample holder, in certain experimental embodiments, is placed on a temperature-controlled heater. The entire heater is placed in a vacuum chamber (~10–6 torr) to avoid oxidation of ZnSe, and to maintain thermal stability. The source is observed through a $CaF_2$ window on the vacuum chamber. The thermal emission is collected by a parabolic mirror and sent through an aperture to a Fourier transform infrared (FTIR) spectrometer. The use of the aperture allows us to collect emission from only a small area on the sample holder. For each measurement, the collection area is centered on the source by adjusting the position of the aperture until maximum reading is reached. To measure the angular emission, the heater stage can be rotated inside the vacuum chamber. For calibration purposes, a blackbody simulator (e.g., Infrared System Development Corporation 564/301 and IR-301 Blackbody controller) is also measured using the same optical setup. By comparing to such calibration measurement, the absolute power emission can therefore be obtained from the thermal emitters of the present disclosure. The sample is maintained at 553K. Temperature consistency is confirmed by both the thermal controller and the emission spectra. Background emission from the Al sample holder is also characterized and has been subtracted out in the data shown below (consistent with various experimentation/example embodiments herein).

Figure 7:
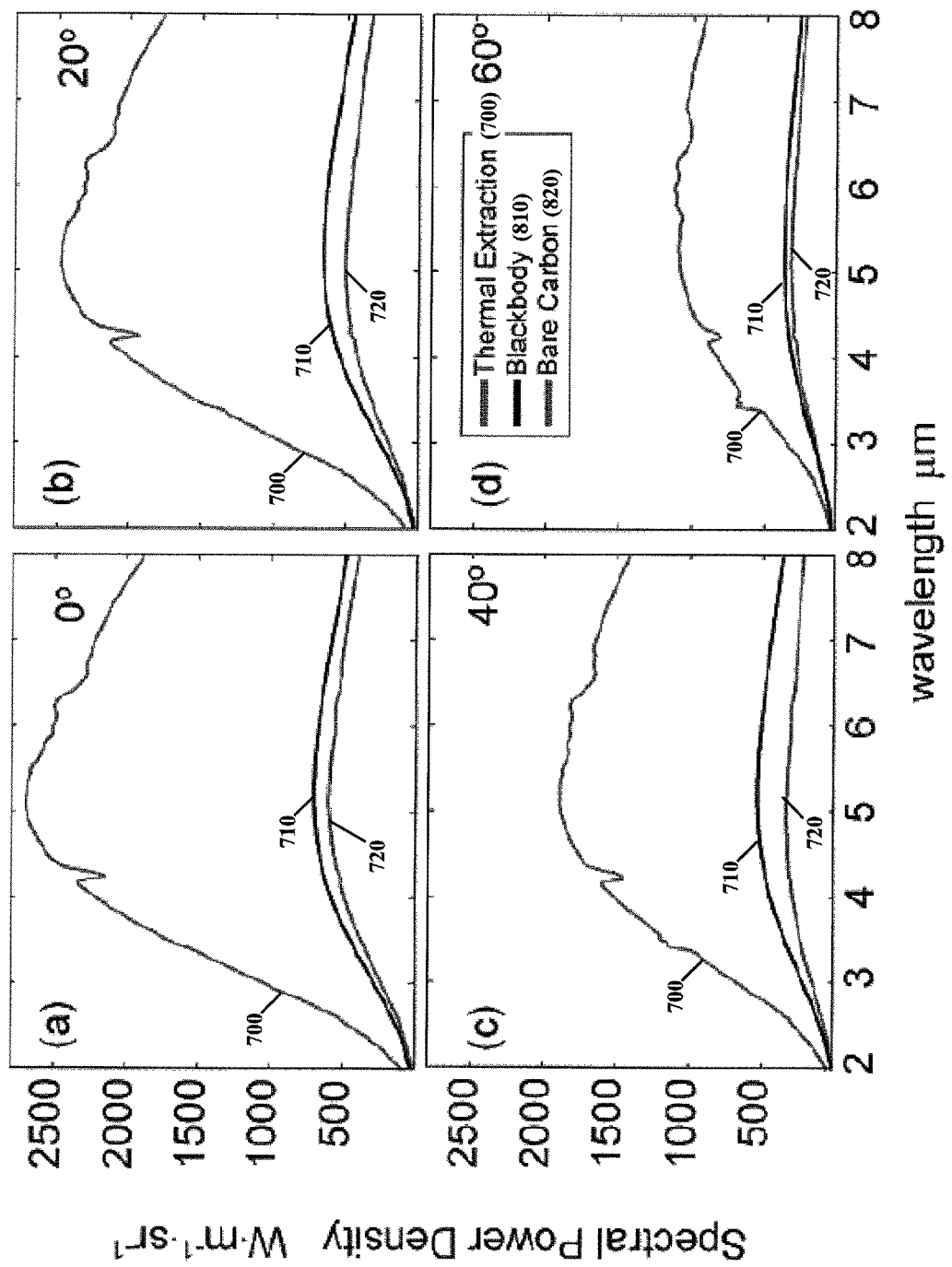
FIG. 7 shows an example emission spectra of the structures at various angles, consistent with various aspects of the present disclosure.

FIG. 7 shows an example emission spectra, measured at 553K, of the structures for collection angles of 0, 20, 40 and 60 degrees. Lines 800 and 820 relate to structures with and without the hemispherical dome, respectively. Lines 810 depict emission power from an ideal blackbody of the same area at the same temperature. The ripples in the curves are believed to be caused by atmosphere absorption. The emission peaks at 5.25 μm wavelength, as expected for a near-black emitter at a temperature of 553K. The spectral density from an ideal blackbody of the same size is plotted as reference (lines 710). As expected, the bare carbon dot (lines 720) emits less than the ideal blackbody, with an emissivity of 0.85 in the normal direction. In the presence of the dome, the emitted power in the normal direction from the same carbon black dot is enhanced by 4.46 fold, representing a 3.79 fold enhancement over the emission by an ideal blackbody, as shown in FIG. 7A. Similar enhancement is observed for off normal directions as well, as seen in FIGS. 7B-D. The enhanced emission results from the extraction of carbon's internal thermal energy, not from the ZnSe hemisphere. To verify this, a reference sample with the ZnSe hemisphere but without the carbon dot is measured, and which showed negligible emission (consistent with various experimentation/example embodiments herein).

Figure 8:
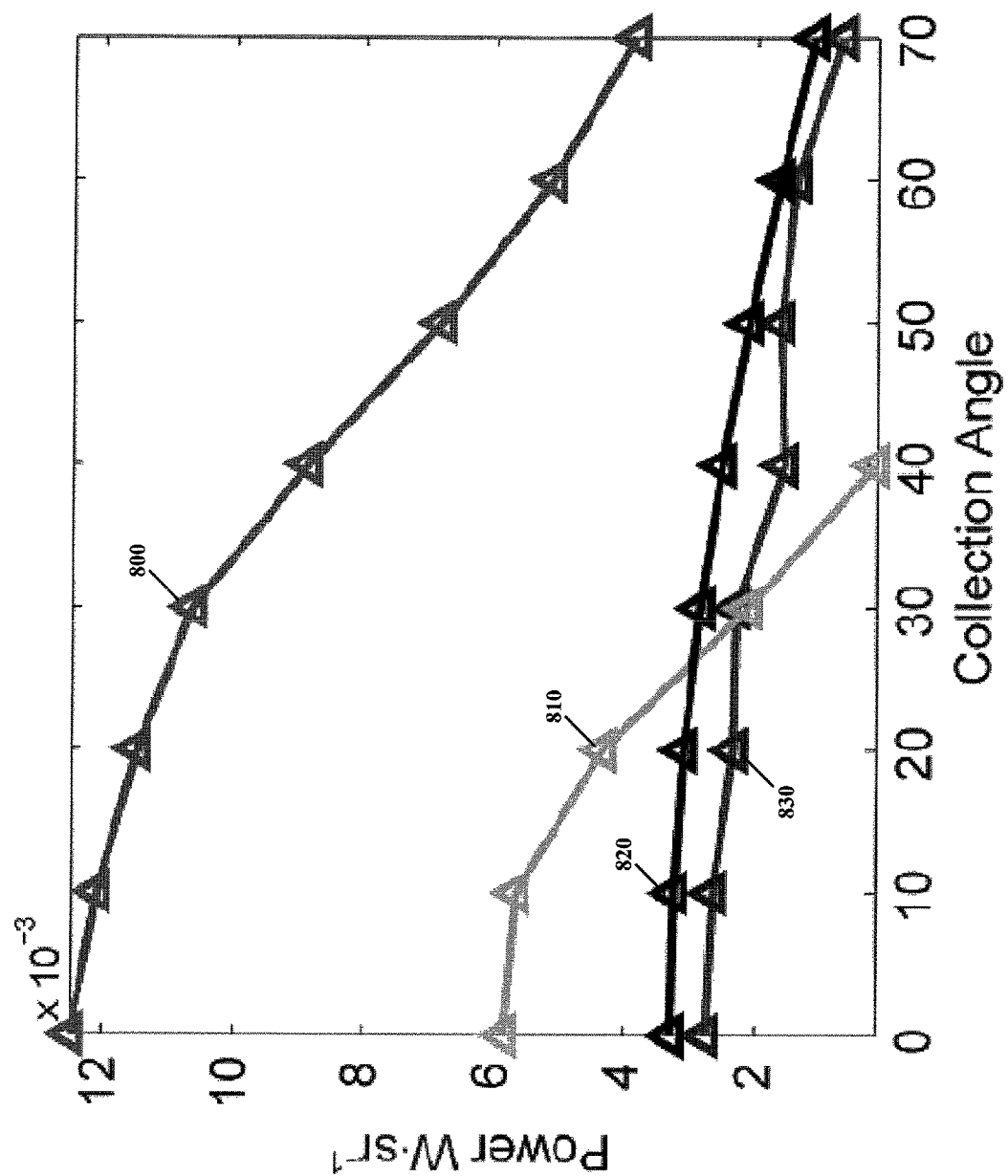
FIG. 8 shows an example angular emission, as obtained by integrating the spectral density over the wavelength range of 2 to 8 µm, consistent with various aspects of the present disclosure.

FIG. 8 shows an example angular emission, as obtained by integrating the spectral density over the wavelength range of 2 to 8 μm. More specifically, FIG. 8 shows experimentally measured emission power from the carbon dot as a function of angle, with the ZnSe hemispherical dome in optical contact (800), without the dome (830), and with the flat surface of the dome separated from the carbon dot by 30 micron (810). For all angles, the presence of the dome results in enhanced emission, as shown by the curve 800 in FIG. 8, as compared to both the carbon black dot without the dome, as shown by the curve 830 in FIG. 8, and an ideal blackbody, as shown by the curve 820 in FIG. 8, of the same area. The total thermal emission is obtained by integrating over all angles and all wavelengths in the range of 2 to 8 μm. The choice of wavelengths between 2-8 μm was due to limits of the experiment and is not limiting. Various embodiments recognize that other/any radiation wavelength can contribute to thermal extraction or coupling. In certain experimental embodiments, the total emission was found to be 10.4 mW for the ideal blackbody, 7.6 mW for the bare carbon dot, and 31.3 mW for the carbon dot with the dome. Accordingly, these experimental results demonstrate that one can significantly enhance the emission of a thermal body beyond the blackbody limit with the thermal extraction scheme. Triangles are measured data points. The black line is the emission power from an ideal blackbody with the same area.

The hemispherical dome used in various embodiments of the present disclosure is a focusing lens. However, the thermal extraction effect is fundamentally different from the focusing effect of the lens. To achieve thermal extraction, in certain embodiments, it is required that all internal states of the emitters can couple into the modes inside the dome. Thus the emitter and the dome must be in optical contact, i.e., the distance between the emitter and the flat surface of the dome must be a great deal smaller than the thermal wavelength. Preventing the optical contact between the emitter and the dome, in various embodiments, eliminates the thermal extraction effect. As a demonstration, a comparison experiment is conducted where the dome is lifted away from the carbon dot by 30 μm, a distance that is large enough to prevent photon tunneling between the emitter and the dome, and small enough to preserve all other geometrical optical lens effects. This is shown in FIG. 9C. The resulting emission power is shown as curve 810 in FIG. 8. In the normal direction, due to the focusing effect of the hemispherical dome, the emission is higher than that that of bare carbon dot, but it quickly diminishes at large angles with negligible emission beyond 40 degrees. Therefore, the geometrical optical effect of ZnSe hemispherical dome, in certain experimental embodiments, redistributes the thermal emission but does not enhance the total emission. The total emitted power is approximately 4.1 mW, below that from the blackbody with the same area at the same temperature.

Figure 9:
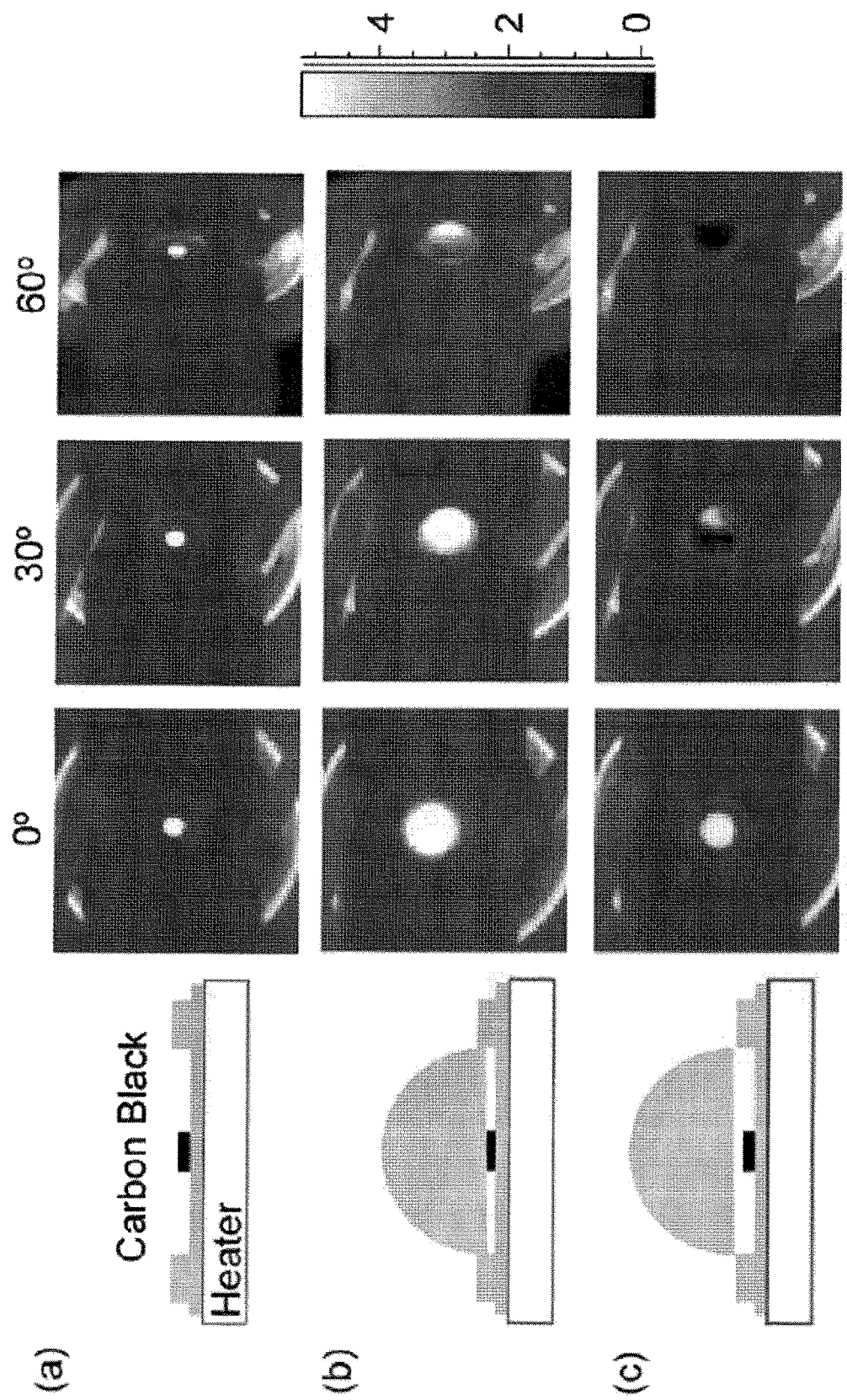
FIG. 9 shows infrared images of the thermal sources maintained at a temperature of 553K, consistent with various aspects of the present disclosure.

FIG. 9 shows infrared images of the thermal sources maintained at a temperature of 553K. Images are taken at 0, 30 and 60 degrees. All images have the same color scale. Values on the color scale bar are linearly proportional to the photon counts of detectors in the camera. In all images, the most outer bright regions are the heater surface beneath the Al sample holder. FIG. 9A shows a bare carbon dot. The Al plate has a holder for the hemisphere, the edge of which is visible due to its slightly higher emissivity. FIG. 9B shows the carbon dot in optical contact with ZnSe. The entire dome lights up at the normal direction and significant emission even at 60 degree angle, demonstrating thermal extraction. FIG. 9C shows ZnSe hemisphere spaced away from carbon dot by 30 μm, a distance sufficient to prevent thermal extraction. In this case, ZnSe hemisphere only redistributes emission among different directions (consistent with various experimentation/example embodiments herein).

As shown in the analysis of FIG. 6, the thermal extraction effect is directly correlated with a broadening of angular distribution of photons on the dome surface. When thermal extraction occurs, the apparent emitting area thus should appear larger from all viewing angles. To demonstrate this, the emitters are directly visualized with an IR camera (e.g., FLIR System Inc. SC4000, spectral range 3 to 5 μm) (FIG. 9). Three cases were compared: the bare carbon dot, the carbon dot in optical contact with the ZnSe dome, and the carbon dot separated from the ZnSe dome by 30 μm. For all three cases, the emitting sources are the same, but as shown in FIGS. 7 and 8, the emitted powers are drastically different. Such differences can be directly visualized with the camera.

In certain embodiments, the bare carbon dot has an emission profile that is approximately Lambertian. The apparent emitting area reduces with increasing angle (as shown in FIG. 9A). When the carbon dot is in optical contact with the hemispherical lens (as shown in FIG. 9B), the effect of thermal extraction produces a much larger apparent emitting area for all viewing angles. This agrees with the angular distribution calculation shown in FIG. 6.

FIG. 9C shows the case where the ZnSe hemisphere is spaced away from the carbon dot. At normal direction, the apparent emitting area is larger as compared with that of the bare dot. But the apparent emitting area decreases very rapidly with angles. At large angles, the apparent emitter area is smaller compared with the case of the bare dot. This again is consistent with the results of FIG. 9, showing that thermal extraction is fundamentally different from a focusing effect.

The concept of thermal extraction is illustrated with the example of a high-index semi-spherical dome. In general, thermal extraction can be accomplished with other geometries as well.

In certain experimental embodiments of the present disclosure, the thermal extraction needs to be in optical contact with the emitter, i.e., the distance between the emitter and the extraction medium needs to be smaller than the thermal wavelength $\lambda = hc/k_B T$. In such embodiments, this ensures that all internal states in the emitter can couple to modes in the extraction medium. However, the thermal extraction medium, in other experimental embodiments, does not need to be in physical contact with the emitter. This is advantageous to prevent thermal conduction between the extraction medium and the emitter.

Further, from a thermodynamics point of view, the thermal extraction medium, in various embodiments of the present disclosure, is used to provide enough radiation channels over the area of the emitter to ensure that all internal modes of the emitter can out-couple. A simple way to accomplish this is to choose the extraction medium such that its density of states is larger than that of the emitter. The size of the extraction medium also needs to be sufficiently large, such that the vacuum region immediately outside the extraction medium has sufficient number of radiation channels to accommodate all the thermal emission. Both of these considerations can be incorporated in the choice of parameters for the hemispherical dome. On the other hand, based upon these considerations, wide variety of nanophotonic structures can be used to satisfy these thermodynamic considerations. For example, structured materials, e.g., photonic crystal and metamaterial, can be engineered to have extremely high channel density. The dispersion relations of the structured materials can also be tailored such that extracted radiations are guided to vacuum interfaces where enough channels in vacuum are available to accommodate the radiation.

In various embodiments of the present disclosure, the structure of the thermal extraction medium in addition to domes may include: (a) a slab that consists of a roughened surface; (b) an irregular shaped polygon; and/or (c) a slab with periodic or non-periodic grating structures, where the grating structures can be made, in certain embodiments, from triangles, or rectangles, or other shaped bumps. These structures can be used alone or in combination.

Additionally, in the extraction medium those optical modes that receive radiation from the emitter, in certain embodiments, need to be accessible to far-field vacuum. This places a constraint on the geometry of the extraction medium. For example, a transparent high index slab with flat surface does not provide thermal extraction. Even though more radiation can enter the slab, those outside the escape cone defined by $\sin^{-1}(1/n_e)$ cannot escape to far-field vacuum due to total internal reflection. Accordingly, the total far-field emission remains the same as $S\sigma T^4$. This particular requirement on making internal optical states accessible to far-field shares the same spirit of the requirement on light trapping in solar cells. Many light trapping structures, for example, roughened slab, irregular polygon, and nanostructured interface can be directly used for thermal extraction.

Aspects of the present disclosure as directed toward the demonstration of thermal extraction opens possibilities for a number of applications. For example, in certain embodiments, the active emitting region of a thermal source is miniaturized because with smaller active region, less power is needed to drive the active region to a prescribed temperature. Aspects of the present disclosure include a constant temperature miniaturization of the active region while maintaining emitted power by decoupling the area of the active emitter and its emitted power, thereby leading to a better thermal emitter with higher power efficiency. Further, in certain embodiments, thermal extraction enhances thermal transport in the far-field for efficient radiative cooling and heating.

Experimental/More-Specific Embodiments

Figure 10:
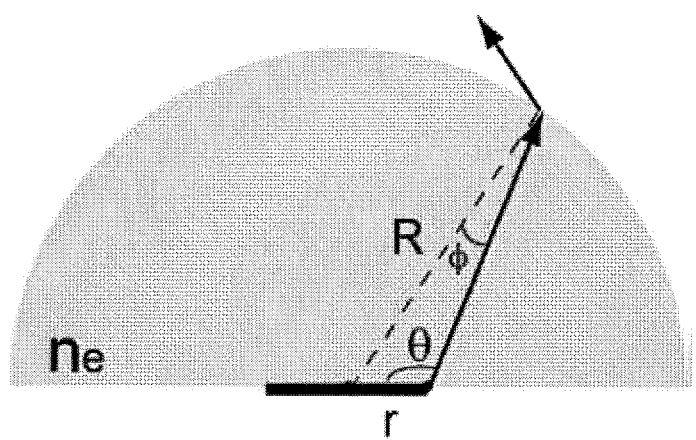
FIG. 10 shows light originating from the source at the bottom of a semi-spherical dome escaping the dome without total internal reflection, consistent with various aspects of the present disclosure.

The following paragraphs describe a various additional experimental or example embodiments of the present disclosure. In one experimental embodiment of the present disclosure, the total internal reflection condition in a semi-spherical dome is derived from the geometry shown in FIG. 10. The geometry in FIG. 10 depicts light originating from the source at the bottom of the semi-spherical dome escaping the dome without total internal reflection. From the geometry shown in FIG. 10, the condition that allows emission from the source area to escape from the dome without total internal reflection is derived. The emitting area has a radius r. The dome has a radius R. At the surface of the dome, the incident angle of the ray is φ. Using the sine rule, we have:

$$\sin(\phi) = \frac{r \sin(\theta)}{R} \qquad \text{Eq. (5)}$$

As a worst-case scenario, we assume a maximum emission cone from the source to the dome, i.e. the maximum value for θ is 90°. To prevent the total internal reflection, $\sin(\phi) \leq 1/n_e$ is required. With these considerations, and using Eq. (5), the result is $R \geq r n_e$.

In connection with embodiments of the present disclosure, an infrared spectroradiometer is utilized. The measurement of spectral radiance from the heated sample is performed with a custom built vacuum emissometer. The sample holder is based on a 1" diameter high temperature heater (HeatWave Labs Model 104863-02) in an ultrahigh vacuum chamber. Samples are mounted on the heater. A feedthrough mechanism allows rotation of the heater in vacuum, in order to measure the angular dependence of the spectral radiance. The axis of rotation is in the plane on which the sample is mounted, thus minimizing sample displacement during rotation. The directional spectral radiance emitted by samples is observed outside the vacuum chamber through a $CaF_2$ window.

In a particular embodiment, external imaging and collimating optics are used to guide the spectral radiance into the entry port of FTIR spectrometer (FTIR: Nicolet 6700 with $CaF_2$ beam splitter and Deuterated Triglycine Sulfate (DTGS) detector with KBr window). The external optical setup consists of a collection and a collimation system. A gold coated 90° off-axis parabolic mirror with focal length f=152.4 mm and diameter D=50.88 mm (Edmund Optics NT47-110) are used to collect the emitted radiation. This mirror images the sample plane onto a tunable aperture. The aperture is tuned in both diameter and position to select the size and the location of the collection area on the sample. A second gold coated 90° off-axis parabolic mirror with focal length f=203.2 mm and diameter D=38.1 mm (Newport 50332AU) is used to collimate the light from the aperture into the entry port of the FTIR spectrometer.

Figure 11A:
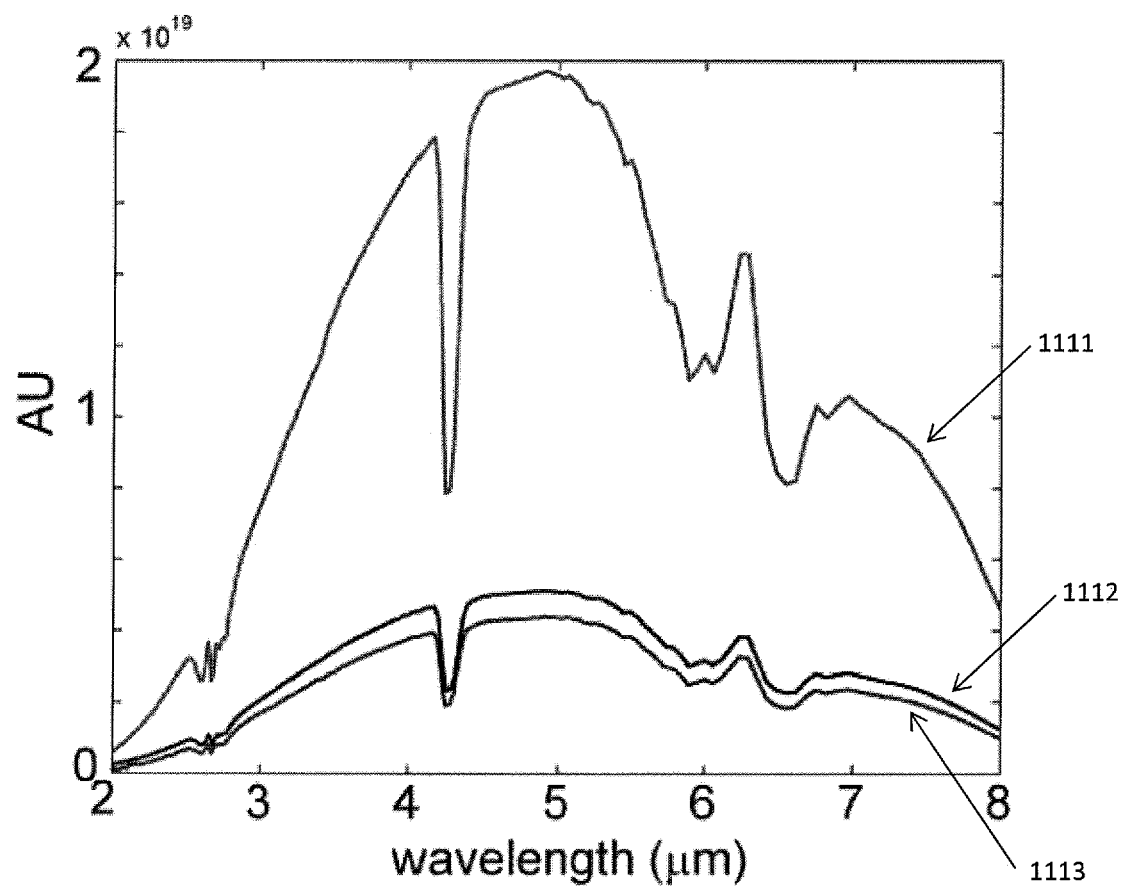
FIG. 11A depicts a raw emission spectrum measured from FTIR, consistent with various aspects of the present disclosure.
Figure 11B:
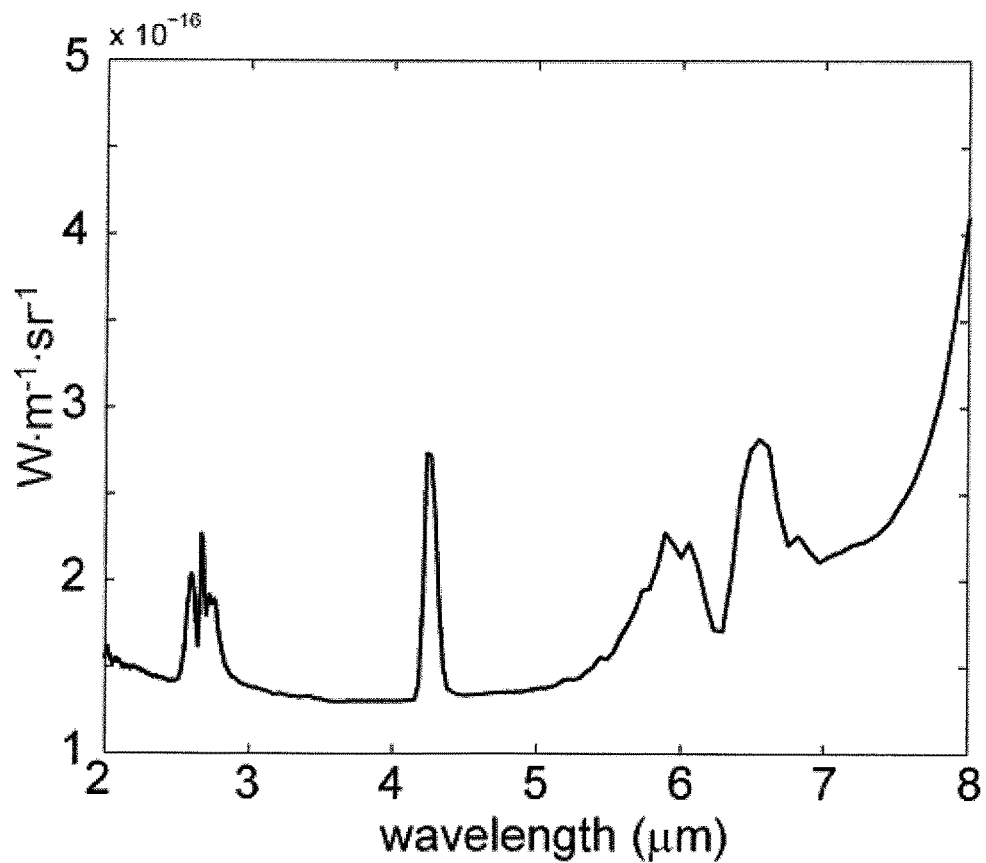
FIG. 11B depicts the transfer function of the system, consistent with various aspects of the present disclosure.

Consistent with one or more experimental or more-specific embodiments, the present disclosure involves converting the raw emission spectrum data by obtaining and using the transfer function of the measurement system. The raw emission spectrum data measured by the FTIR system is in an arbitrary linear unit. FIGS. 11A and 11B show the raw data measured for the bare carbon dot 1113, and the carbon dot in optical contact with the ZnSe dome 1111, both at a temperature of 553K. The emission areas are 3.3 mm². Also, significant atmosphere absorption can be seen in the spectra. To convert this arbitrary unit to power measurement, the transfer function of the system must be obtained.

In such experimental embodiments, the transfer function is obtained by calibrating the system to a known blackbody emitter simulator 1112 (Infrared System Development Corporation 564/301 and IR-301 Blackbody controller). The blackbody simulator consists of a cone cavity with black absorptive inner surface. The open area of the cone has emissivity over 0.99. The emission is collected by the same optical configuration. The collection area is controlled by the aperture size. By assuming the known emitter as an ideal blackbody and thus having a standard Planck's law emission, the transfer function of the system shown in FIG. 11B is obtained. The transfer function converts the measured FTIR signal to absolute power emission. The spectral densities in the following embodiments of the present disclosure are obtained by multiplying the transfer function with the raw signal measured from FTIR.

In one such more-specific (or experimental) embodiment of the present disclosure, the surface temperature of the sample is determined by utilizing a reference blackbody simulator. The samples are maintained at the same temperature for measurement. The heater controller is set to be the same temperature for all measurements. The samples are placed on the heater surface in vacuum, and thus isolated from heat transfer by conduction and convection. Measurements are performed 45 minutes after the set temperature is reached to help the sample reach steady state.

Figure 12:
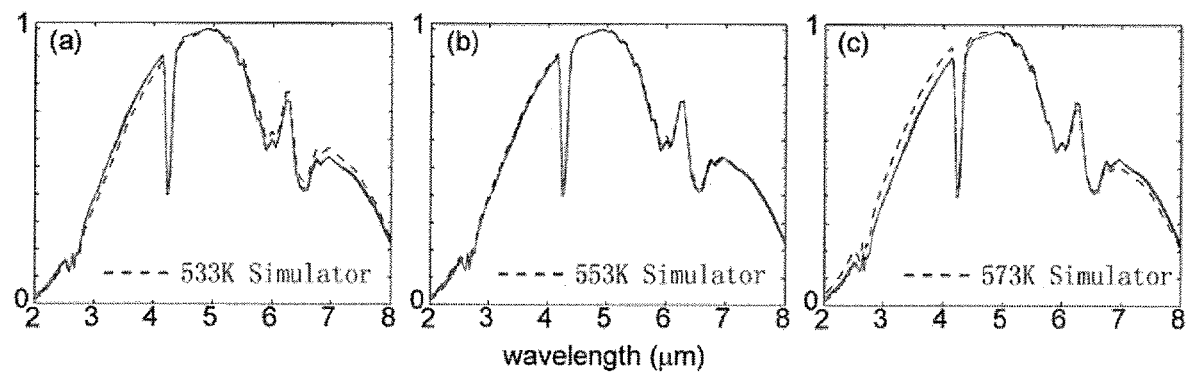
FIG. 12 (a-c) depicts the normalized spectra measured by FTIR, consistent with various aspects of the present disclosure.

In FIG. 12, the temperature consistency for different measurements is confirmed by the lineshapes of the emission. FIG. 12 shows the normalized spectra measured by the FTIR, specifically, the normalized lineshapes for the emission measured for the bare carbon dot, and the carbon dot in optical contact with the dome. These lineshapes overlap very well, showing that they are at the same temperature (FIG. 12, solid lines).

The emission lineshapes of the samples are matched to those of a reference blackbody simulator (Infrared System Development Corporation 564/301) to obtain the sample surface temperature. The carbon blackbody simulator's emissivity has little wavelength dependency in the measured spectral range, allowing for the comparison. The reference blackbody emitter's temperature is maintained by Infrared System Development Corporation IR-301 Blackbody controller. Spectra of the reference blackbody are measured from 533K to 573K (FIG. 12, dashed lines). The 553K lineshape shows the best match with the sample spectra (FIG. 12(a)), while 533K and 573K show significant deviation (FIG. 12(b), 12(c)). The sample temperature is determined to be 553±10K.

In a particular experimental embodiment of the present disclosure, the background emissions are determined and subtracted from the emissions results. The aluminum sample holder has small but finite emission, whereas, the ZnSe hemisphere by itself emits very little thermal radiation.

Figure 13:
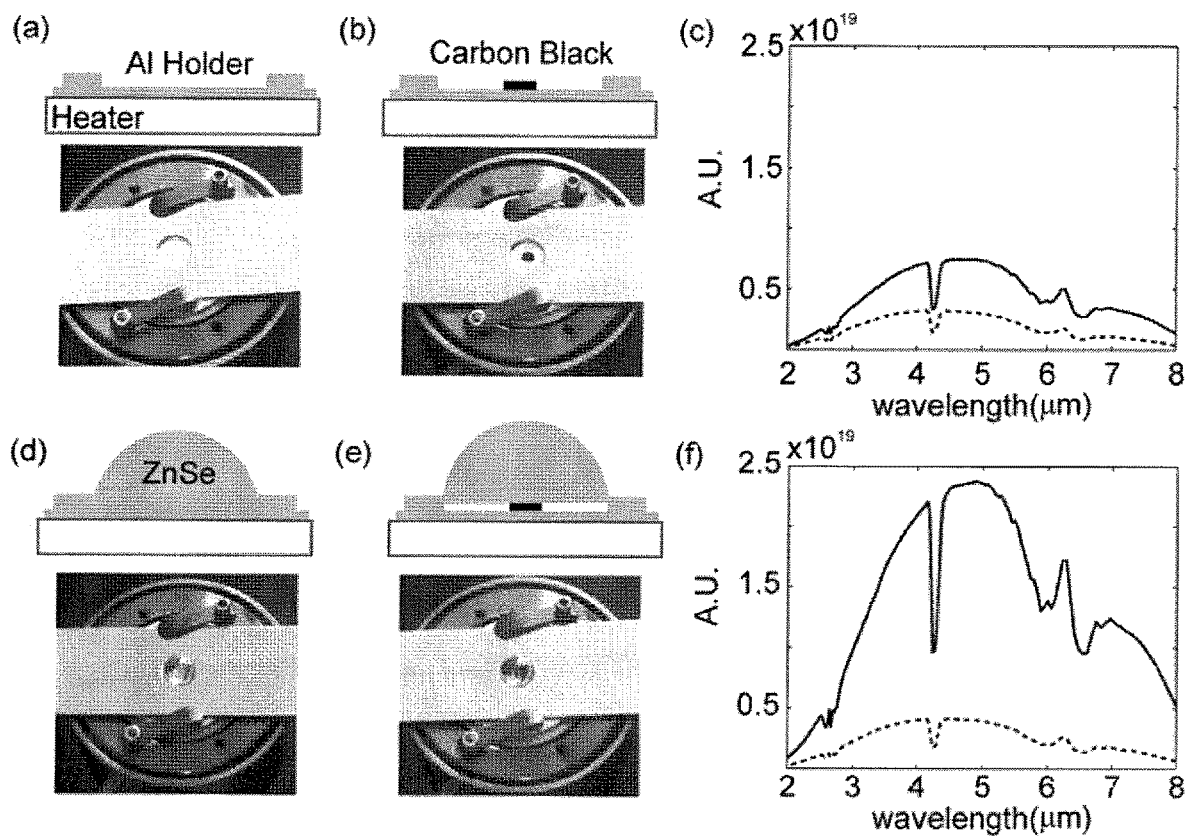
FIG. 13 (a-f) depicts a series of experiments to determine the background emission from sample holders and ZnSe hemisphere, consistent with various aspects of the present disclosure.

To determine the background emissions, first, the sample holder without carbon dot is measured (FIG. 13(a)). Its emission is shown by FIG. 13(c) with dashed line. The collection area is slightly larger than the center circular aperture shown in FIG. 13(a). The collection area includes a circular edge which is used later on to fix the ZnSe hemisphere. Then, carbon dot is coated on the Al sample holder (FIG. 13(b)). Despite its small area compared to the collection area, the carbon dot (solid line in FIG. 13(c)) dominates the emission as compared to the background emission from the aluminum sample holder (FIG. 13(c), dashed line). The emissions shown in the detailed description are obtained by subtracting out the background emission. Similarly, measurements are performed for the ZnSe hemisphere, with (FIG. 13(e)), and without the carbon dot (FIG. 13(d)). FIG. 13(f) shows the emission spectra of the structures in FIGS. 13(d) and (e). Dashed and solid lines in FIG. 13(f) represent the setups in FIG. 13(d) and FIG. 13(e) respectively. ZnSe does not have significant thermal emission, as can be seen by comparing the dashed lines in FIGS. 13(c) and 13(f). The enhanced thermal emission in FIG. 13(f), in the presence of the carbon dot, is purely from extracting the internal thermal radiation energy from the carbon dot.

Figure 14:
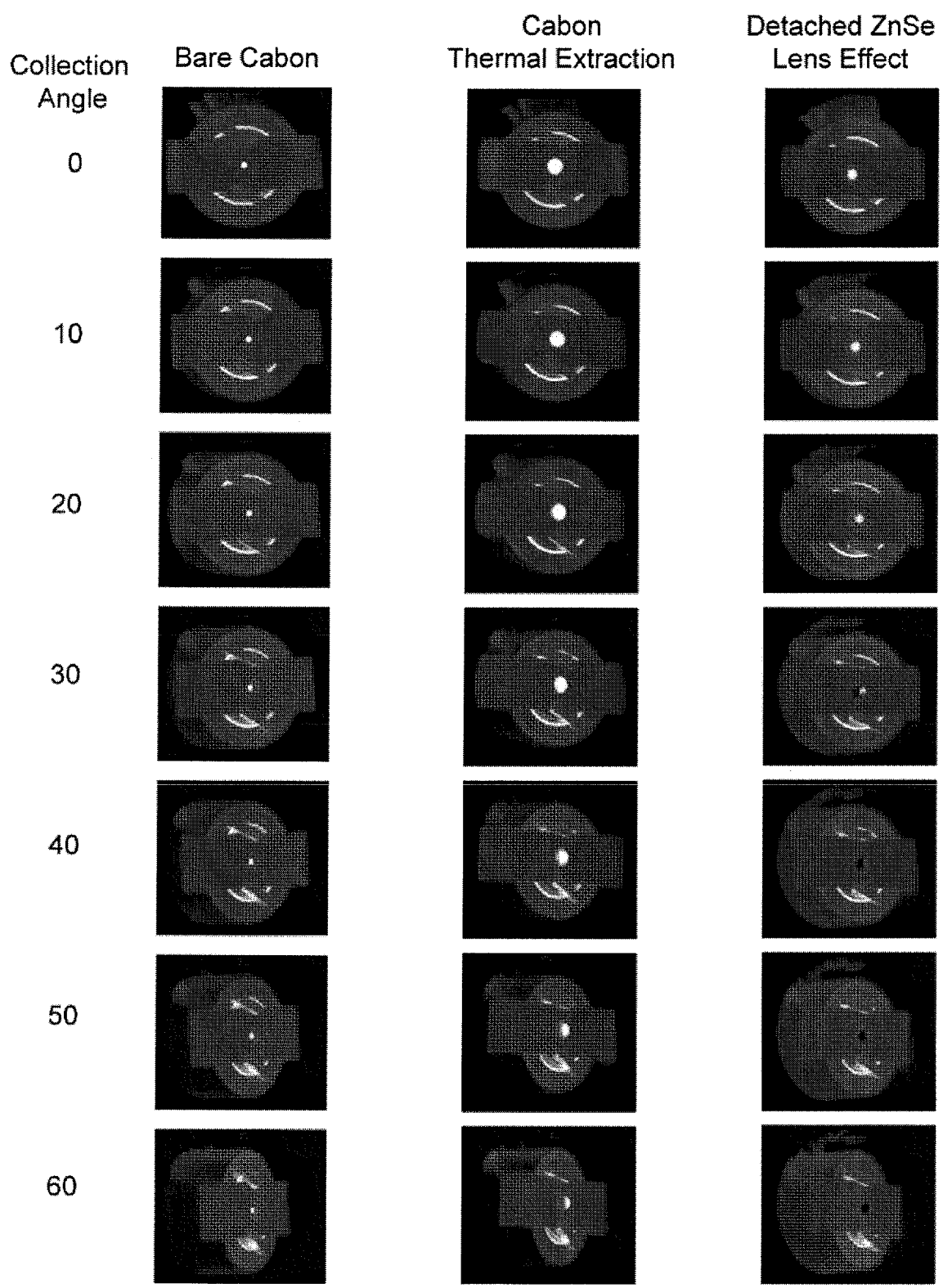
FIG. 14 shows infrared camera images for angles from 0 to 60 degrees, consistent with various aspects of the present disclosure.

In FIG. 14, an alternative experimental embodiment of the present disclosure relies on infrared imaging to determine the surface temperature of the samples. An infrared camera based on an InSb photodiode array image sensor with 320×256 pixels. The specified spectral range is 3.0 to 5.0 µm. Images are read out as raw data, which are proportional to the received number of photons within the spectral range of the camera. Pixel-to-pixel responsivity variations are negligible for the purposes of this work. The camera views the sample through the CaF$_2$ window on the vacuum chamber via a plane gold mirror with high reflectance. A 50 mm focal length f/2.5 lens was used. The sample holder allows observation of the emission source for angles out to about 70 degrees (with some obscuration occurring at larger angles). FIG. 14 shows the progression of the source emission with increasing off-axis angles, from 0 to 60 degrees. In FIG. 14, the left panels are for a bare carbon dot, the middle panels are for the carbon dot in optical contact with the ZnSe dome, and the right panels are for the carbon dot separated from the flat surface of the ZnSe dome by 30 µm. The artificial color scale is the same in all images.

The embodiments and specific applications discussed herein (and in the Appendices filed as part of the underlying provisional application) may be implemented in connection with one or more of the above-described aspects, embodiments and implementations, as well as with those shown in the appended figures. This description and the various embodiments are also presented by of the provisional patent document, Application No. 61/714,557 filed on Oct. 16, 2012, and its appendices, the entirety of which is hereby fully incorporated by reference into the present application.

Various embodiments described above, and discussed in provisional patent application and its Appendices may be implemented together and/or in other manners. One or more of the items depicted in the present disclosure and in the Appendices can also be implemented in a more separated or integrated manner, or removed and/or rendered as inoperable in certain cases, as is useful in accordance with particular applications. In view of the description herein, those skilled in the art will recognize that many changes may be made thereto without departing from the spirit and scope of the present disclosure.

What is claimed is:

1. A device manifesting a level of emission from or to a thermal emitting area as measured relative to a blackbody having a theoretical thermal emitting area, the thermal emitting area and the theoretical thermal emitting area characterized by a common geometric cross-sectional area, the device comprising:
a macroscopic thermal body having the thermal emitting area; and
an extraction structure that is electromagnetically-coupled to the thermal emitting area of the thermal body and configured and arranged to facilitate the level of emission with an external medium from or to the thermal emitting area;
wherein the extraction structure is configured and arranged to
provide sufficient radiation channels over the thermal emitting area to increase a number of internal modes of the thermal emitting area that couple to the external medium, or
have an electromagnetic density of states that is at least equal to that of the thermal emitting area; and
wherein the level of emission facilitated by the extraction structure exceeds a theoretical, Stefan-Boltzmann emission limit for the blackbody having the theoretical thermal emitting area with the common geometric cross-sectional area.

2. The device of claim 1, wherein the macroscopic thermal body has internal electromagnetic density of states that is greater than internal electromagnetic density of states of a vacuum.

3. The device of claim 1, wherein the extraction structure is configured and arranged with an index of refraction that is greater than that of air and to pass the emission between the thermal body and the external medium.

4. The device of claim 1, wherein the extraction structure is configured and arranged to provide enough radiation channels over the thermal emitting area to increase the number of internal modes of the thermal emitting area that couple to the external medium.

5. The device of claim 1, wherein the extraction structure is configured and arranged to have the electromagnetic density of states that is at least equal to that of the thermal emitting area.

6. A device manifesting a level of emission from or to a thermal emitting area as measured relative to a blackbody having a theoretical thermal emitting area, the thermal emitting area and the theoretical thermal emitting area characterized by a common geometric cross-sectional area, the device comprising:
a macroscopic thermal body having the thermal emitting area; and
an extraction structure that is electromagnetically-coupled to the thermal emitting area of the thermal body and configured and arranged to facilitate the level of emission with an external medium from or to the thermal emitting area;
wherein the level of emission facilitated by the extraction structure exceeds a theoretical, Stefan-Boltzmann emission limit for the blackbody having the theoretical thermal emitting area with the common geometric cross-sectional area, wherein the extraction structure is a hemisphere-shaped structure with a radius (R) and an index of reflection ($n_e$) and is configured and arranged to provide accessibility to a far-field medium for optical modes that couple radiation with the thermal emitting area, and the macroscopic thermal body is a disk shaped-structure with a radius (r).

7. The device of claim 6, wherein the extraction structure is configured and arranged to provide the accessibility by way of constraints on a geometry of the extraction medium, and wherein the extraction structure and the macroscopic thermal body are arranged such that R is greater than or equal to $n_e r$.

8. A device manifesting a level of emission from or to a thermal emitting area as measured relative to a blackbody having a theoretical thermal emitting area, the thermal emitting area and the theoretical thermal emitting area characterized by a common geometric cross-sectional area, the device comprising:
   a macroscopic thermal body having the thermal emitting area; and
   an extraction structure that is electromagnetically-coupled to the thermal emitting area of the thermal body and configured and arranged to facilitate the level of emission with an external medium from or to the thermal emitting area;
   wherein the level of emission facilitated by the extraction structure exceeds a theoretical, Stefan-Boltzmann emission limit for the blackbody having the theoretical thermal emitting area with the common geometric cross-sectional area, the extraction structure is configured to absorb a fraction of the emission, the macroscopic thermal body is formed by an open area of an absorptive cavity, and the extraction structure is a semi-spherical dome configured and arranged at an entrance of the absorptive cavity.

9. The device of claim 8, wherein the device is configured to cool a heat source using a heat capacity of the extraction structure, wherein the extraction structure is a focusing lens shaped as the semi-spherical dome.

10. The device of claim 8, wherein the device is configured to cool a heat source, including circuitry, by absorption of radiation in the extraction structure, combined with conduction of heat away from a surface of the extraction structure.

11. A device manifesting a level of emission from or to a thermal emitting area as measured relative to a blackbody having a theoretical thermal emitting area, the thermal emitting area and the theoretical thermal emitting area characterized by a common geometric cross-sectional area, the device comprising:
   a macroscopic thermal body having the thermal emitting area; and
   an extraction structure that is electromagnetically-coupled to the thermal emitting area of the thermal body and configured and arranged to facilitate the level of emission with an external medium from or to the thermal emitting area;
   wherein the level of emission facilitated by the extraction structure exceeds a theoretical, Stefan-Boltzmann emission limit for the blackbody having the theoretical thermal emitting area with the common geometric cross-sectional area, the extraction structure is configured and arranged to absorb a fraction of the emission and to cool a heat source using a heat capacity of the extraction structure by absorption of the emission in the extraction structure combined with conduction of heat away from the thermal emitting area.

12. The device of claim 1, wherein the extraction structure is configured and arranged to be close enough to the macroscopic thermal body to allow for photon tunneling between the macroscopic thermal body and the extraction structure.

13. The device of claim 12, wherein a distance between the extraction structure and the macroscopic thermal body is less than a wavelength of emitted or received thermal energy.

14. The device of claim 12, wherein the extraction structure does not contact the macroscopic thermal body.

15. The device of claim 14, wherein the extraction structure is configured to be maintained at a temperature independent of a temperature for the macroscopic thermal body.

16. A device manifesting a level of emission from or to a thermal emitting area as measured relative to a blackbody having a theoretical thermal emitting area, the thermal emitting area and the theoretical thermal emitting area characterized by a common geometric cross-sectional area, the device comprising:
   a macroscopic thermal body having the thermal emitting area; and
   an extraction structure that is electromagnetically-coupled to the thermal emitting area of the thermal body and configured and arranged to facilitate the level of emission with an external medium from or to the thermal emitting area;
   wherein the level of emission facilitated by the extraction structure exceeds a theoretical, Stefan-Boltzmann emission limit for the blackbody having the theoretical thermal emitting area with the common geometric cross-sectional area, wherein the emission from or receipt to the thermal emitting area exceeds the Stefan-Boltzmann emission limit for a blackbody having the same thermal emitting area as the thermal body by a factor of at least 3.

17. A device manifesting a level of emission from or to a thermal emitting area as measured relative to a blackbody having a theoretical thermal emitting area, the thermal emitting area and the theoretical thermal emitting area characterized by a common geometric cross-sectional area, the device comprising:
   a macroscopic thermal body having the thermal emitting area; and
   an extraction structure that is electromagnetically-coupled to the thermal emitting area of the thermal body and configured and arranged to facilitate the level of emission with an external medium from or to the thermal emitting area;
   wherein the level of emission facilitated by the extraction structure exceeds a theoretical, Stefan-Boltzmann emission limit for the blackbody having the theoretical thermal emitting area with the common geometric cross-sectional area, wherein the extraction structure is configured and arranged to facilitate the emission level from or to the thermal emitting area by increasing radiation coupling with the thermal body to an emission level beyond the Stefan-Boltzmann emission limit, through the extraction structure and with the external medium via far-field radiation.

18. A device manifesting a level of emission from or to a thermal emitting area as measured relative to a blackbody having a theoretical thermal emitting area, the thermal emitting area and the theoretical thermal emitting area characterized by a common geometric cross-sectional area, the device comprising:
- a macroscopic thermal body having the thermal emitting area; and
- an extraction structure that is electromagnetically-coupled to the thermal emitting area of the thermal body and configured and arranged to facilitate the level of emission with an external medium from or to the thermal emitting area;
- wherein the level of emission facilitated by the extraction structure exceeds a theoretical, Stefan-Boltzmann emission limit for the blackbody having the theoretical thermal emitting area with the common geometric cross-sectional area, wherein the extraction structure is configured and arranged to transfer radiation between the thermal body and the external medium utilizing far-field radiation while enhancing radiation coupling with the thermal body beyond the Stefan-Boltzmann emission limit.

19. A device manifesting a level of emission from or to a thermal emitting area as measured relative to a blackbody having a theoretical thermal emitting area, the thermal emitting area and the theoretical thermal emitting area characterized by a common geometric cross-sectional area, the device comprising:
- a macroscopic thermal body having the thermal emitting area; and
- an extraction structure electromagnetically-coupled to the thermal emitting area of the thermal body and configured and arranged to facilitate a level of emission from or to the thermal emitting area;
- wherein the level of emissions facilitated by the extraction structure exceeds a theoretical, Stefan-Boltzmann emission limit for the blackbody having the theoretical thermal emitting area with the common geometric cross-sectional area, without photon tunneling.

20. A device manifesting a level of emission from or to a thermal emitting area as measured relative to a blackbody having a theoretical thermal emitting area, the thermal emitting area and the theoretical thermal emitting area characterized by a common geometric cross-sectional area, the device comprising:
- a macroscopic thermal body having the thermal emitting area; and
- an extraction structure that is electromagnetically-coupled to the thermal emitting area of the thermal body and configured and arranged to facilitate the level of emission with an external medium from or to the thermal emitting area;
- wherein the level of emission facilitated by the extraction structure exceeds a theoretical, Stefan-Boltzmann emission limit for the blackbody having the theoretical thermal emitting area with the common geometric cross-sectional area, wherein the extraction structure is configured and arranged to facilitate the level emission from or to the thermal emitting area by increasing an amount of radiation emissions coupled with the thermal body to a level of radiation emissions that exceeds the Stefan-Boltzmann limit, and wherein the extraction structure is configured and arranged to have an electromagnetic density of states that is greater than that of the thermal emitting area.

* * * * *